(12) United States Patent
Kadokura et al.

(10) Patent No.: US 6,881,311 B2
(45) Date of Patent: Apr. 19, 2005

(54) FACING-TARGETS-TYPE SPUTTERING APPARATUS

(75) Inventors: Sadao Kadokura, Hachioji (JP); Hisanao Anpuku, Kokubunji (JP)

(73) Assignee: FTS Corporation, Tokyo (JP)

( * ) Notice: Subject to any disclaimer, the term of this patent is extended or adjusted under 35 U.S.C. 154(b) by 182 days.

(21) Appl. No.: 10/294,667

(22) Filed: Nov. 15, 2002

(65) Prior Publication Data

US 2003/0094365 A1 May 22, 2003

(30) Foreign Application Priority Data

Nov. 19, 2001 (JP) ........................................ 2001-352606

(51) Int. Cl.⁷ .............................................. C23C 14/35
(52) U.S. Cl. ............................. 204/298.18; 204/298.19; 204/298.11; 204/298.16; 204/298.09
(58) Field of Search ....................... 204/298.16, 298.17, 204/298.18, 298.19, 298.14, 298.11, 298.06, 298.09

(56) References Cited

U.S. PATENT DOCUMENTS

| | | | | |
|---|---|---|---|---|
| 4,407,894 A | | 10/1983 | Kadokura et al. | 428/457 |
| 4,427,524 A | * | 1/1984 | Crombeen et al. | 204/298.06 |
| 4,600,490 A | * | 7/1986 | Gillery et al. | 204/298.19 |
| 4,784,739 A | | 11/1988 | Kadokura et al. | 204/192.2 |
| 4,880,515 A | * | 11/1989 | Yoshikawa et al. | 204/192.12 |
| 5,196,105 A | * | 3/1993 | Feuerstein et al. | 204/298.19 |
| 6,156,172 A | * | 12/2000 | Kadokura | 204/298.26 |

FOREIGN PATENT DOCUMENTS

| | | |
|---|---|---|
| JP | B2 62-14633 | 4/1987 |
| JP | B2 63-20303 | 4/1988 |
| JP | B2 63-20304 | 4/1988 |
| JP | B2 H5-75827 | 10/1993 |
| JP | A H10-330936 | 12/1998 |

* cited by examiner

Primary Examiner—Rodney G. McDonald
(74) Attorney, Agent, or Firm—Westerman, Hattori, Daniels & Adrian, LLP

(57) ABSTRACT

Disclosed is a facing-targets-type sputtering apparatus including a sputtering unit including a pair of facing targets which are disposed a predetermined distance away from each other, and permanent magnets serving as magnetic-field generation means which are disposed around each of the facing targets, the permanent magnets being provided so as to generate a facing-mode magnetic field and a magnetron-mode magnetic field, the facing-mode magnetic field extending in the direction perpendicular to the facing targets in such a manner as to surround a confinement space provided between the targets, and the magnetron-mode magnetic field extending from the vicinity of a peripheral edge portion of each of the targets to a center portion thereof, thereby confining plasma within the confinement space by means of these magnetic fields for forming a thin film on a substrate disposed beside the confinement space, which apparatus further includes magnetic-field regulation means for regulating the magnetron-mode magnetic field. The magnetic-field regulation means is formed of, for example, a permanent magnet, and is provided on the back side of each of the targets.

25 Claims, 8 Drawing Sheets

Distribution of Magnetic Fluxes in a Conventional Apparatus

FACING-TARGETS-TYPE SPUTTERING APPARATUS

BACKGROUND OF THE INVENTION

1. Field of the Invention

The present invention relates to a facing-targets-type sputtering apparatus including a sputtering unit, in which a pair of facing targets are disposed a predetermined distance away from each other, and permanent magnets are disposed along the periphery of each facing target such that magnetic poles of one target face the corresponding magnetic poles of the other target. The sputtering apparatus is configured such that a magnetic field extending in the direction perpendicular to the facing targets is generated in such a manner as to surround a space provided between the facing targets (the space is hereinafter called a "confinement space") so as to confine plasma within the confinement space and to perform sputtering of the targets, thereby forming a film on a substrate disposed beside the confinement space.

2. Description of the Related Art

A facing-targets-type sputtering apparatus is disclosed in Japanese Patent Publication (kokoku) Nos. 63-20303, 63-20304, and 62-14633 previously filed by the present inventors. The sputtering apparatus have a basic structure shown in FIG. 1 (Prior Art). Specifically, the apparatus includes a sputtering unit including targets 110a and 110b, and permanent magnets 130a and 130b serving as magnetic-field generation means. The targets 110a and 110b are disposed a predetermined distance away from each other within a vacuum chamber 10, thereby providing a confinement space 120 therebetween. The permanent magnets 130a and 130b are disposed behind the corresponding targets 110a and 110b in order to generate a magnetic field which extends in the direction extending between the targets 11a and 110b and which uniformly surrounds the confinement space 120. A substrate holder 21 disposed beside the confinement space 120 holds a substrate 20 such that the substrate 20 faces the confinement space 120. In FIG. 1, reference numeral 11 denotes a chamber wall of the vacuum chamber 10, and reference numerals 140a and 140b denote shields for protecting, from sputtering, portions of target units 100a and 100b other than the front surfaces of the targets 111a and 110b.

After the vacuum chamber 10 is evacuated through an evacuation port 30 by means of an unillustrated evacuation system, a sputtering gas, such as argon, is introduced into the vacuum chamber 10 through a gas inlet 40 by means of unillustrated gas introduction means so as to attain a predetermined pressure. As shown in FIG. 1, a DC sputtering power supply 50 supplies sputtering power to the apparatus while the shields 140a and 140b; i.e., the vacuum chamber vessel 10, serve as an anode (ground) and the targets 110a and 110b serve as a cathode. Thus, sputtering plasma is generated within the confinement space 120, and the sputtering plasma effects sputtering of the targets 110a and 110b, thereby forming on the substrate 20 a thin film whose composition corresponds to that of the targets 110a and 110b. Depending on the composition of the targets, the sputtering power supply may be a high-frequency power supply.

Since the magnetic field extends in the direction perpendicular to the targets 110a and 110b, high-energy electrons are confined within the confinement space 120, and plasma is generated therein. The plasma accelerates ionization of the sputtering gas, thereby increasing a sputtering rate and thus forming a film at high rate. Unlike the case of a planar-magnetron-type sputtering apparatus (typical conventional sputtering apparatus) in which a substrate is disposed so as to face a target, the substrate 20 is disposed beside the targets 110a and 110b. Therefore, ions and electrons which impinge on the substrate 20 are greatly reduced, and thermal radiation from the targets 110a and 110b to the substrate 20 is reduced, thereby suppressing an increase in substrate temperature. Thus, a film can be formed at low temperature. Unlike the case of such a conventional magnetron-type sputtering apparatus, which encounters difficulty in forming a film of magnetic material at high rate, the facing-targets-type sputtering apparatus enables formation of films of various materials including magnetic material at low temperature and at high rate, and has thus been employed for producing a variety of thin films, including magnetic thin films for thin-film-type magnetic recording media and magnetic heads, metallic films, metal oxide films, and ceramic films.

The facing-targets-type sputtering apparatus generally employs rectangular or circular targets. However, regardless of target shape, a target tends to be sputtered intensively at a central portion of the target surface, indicating the necessity to improve target utilization efficiency. When a rectangular target extending in a width direction of a substrate is employed, a target erosion pattern becomes asymmetrical with respect to the center of the target. As a result, variation in film thickness arises in a width direction of the substrate, indicating the necessity to improve productivity and uniformity of film thickness.

In order to solve the aforementioned problems, the present inventors have proposed, in Japanese Patent Publication (kokoku) No. 5-75827, a technique for improving a feature of a facing-targets-type sputtering method; i.e., a technique for attaining confinement of plasma over the entire surface of a target under uniform conditions. In order to generate and confine sputtering plasma, the proposed technique employs electron reflection means for reflecting electrons toward a space in the vicinity of a peripheral edge portion of a target, in addition to magnetic-field generation means for generating a magnetic field in the direction perpendicular to the target surface, the magnetic-field generation means being provided along the peripheral edge portion of the target and employed in a conventional facing-targets-type sputtering method. In a sputtering apparatus employing this technique, in addition to a magnetic field in the direction perpendicular to the target (i.e., a facing-mode magnetic field), a magnetron-mode magnetic field, which is generated in a conventional planar-magnetron sputtering apparatus, is generated in the vicinity of the peripheral edge portion of the target, and extends from the electron reflection means toward the center portion of the target. Therefore, high-energy electrons drift by means of the facing-mode magnetic field within a space provided between a pair of facing targets, and drift by means of the magnetron-mode magnetic field over the peripheral edge portion of each of the targets without being absorbed by magnetic poles. Thus, the ionization efficiency of a sputtering gas is significantly enhanced, and sputtering efficiency is enhanced over the entire surface of the targets. This sputtering technique enables formation of a thin film of very fine structure with excellent characteristics, as compared with a case of a conventional sputtering method in which a substrate and a sputtering source face each other and which cannot form a thin film in such a manner. Also, the technique permits almost uniform erosion of the target over its entire surface. Therefore, even when sputtering of a rectangular target is performed, the symmetry of a target erosion pattern with respect to a central portion of the target is improved.

Industrialization of such a sputtering apparatus requires improvements to productivity and long-term reliability. In order to meet such requirements, the present inventors have proposed, in Japanese Patent Application Laid-Open (kokai) No. 10-330936, a facing-targets-type sputtering apparatus including a target support unit having a cooling section and a section for accommodating a permanent magnetic serving as magnetic-field generation means, in which the permanent magnet is separated from a vacuum chamber and can be cooled. Through use of the sputtering apparatus, a film of high quality can be formed. In addition, power applied to the apparatus can be increased greatly, and performance of the permanent magnet can be maintained over a long period of time. FIG. 2 shows distribution of the magnetic fluxes of magnetic fields in the sputtering apparatus disclosed in Japanese Patent Publication (kokoku) No. 5-75827 or Japanese Patent Application Laid-Open (kokai) No. 10-330936.

Meanwhile, industrialization of the aforementioned facing-targets-type sputtering apparatus has been found to require the below-described improvements.

When, by use of the aforementioned conventional facing-targets-type sputtering apparatus, a film is formed on a substrate having a high width/length ratio or continuous film formation is performed while a substrate is conveyed at a predetermined rate, like the case where continuous film formation is performed through other physical deposition methods, variation in film thickness arises in a width direction of the substrate (as used herein, the expression "width direction" refers to the direction perpendicular to the sheet in FIG. 1). The aforementioned conventional facing-targets-type sputtering apparatus includes no means for regulating such variation in film thickness in the width direction, and the degree of variation in film thickness in the width direction depends on the size of a target. Therefore, in order to reduce variation in the thickness of a film to a predetermined level, a target having a long width must be employed. Thus, a large-sized apparatus is required, and utilization efficiency of a target is lowered, resulting in high production costs. Therefore, industrialization of the aforementioned sputtering apparatus requires improvements in relation to production costs.

Meanwhile, when formation of a thin film is performed by use of a rectangular target of a non-magnetic material in the aforementioned sputtering apparatus over a long period of time, although the entire surface of the target is almost uniformly eroded, the degree of erosion of a first pair of diagonal corners of the target somewhat differs from that of a second pair of diagonal corners of the target. Therefore, industrialization of the sputtering apparatus has been found to require improvements in terms of utilization efficiency of a target and long-term operation of the apparatus.

As the aforementioned facing-targets-type sputtering apparatus is employed in a variety of fields, the below-described demands in terms of film formation have arisen for the sputtering apparatus.

(1) Realization of formation of a functional film at a low temperature while suppressing heating of a substrate. This demand arises particularly when a plastic substrate is employed or a functional film is formed on an organic underlying layer.

(2) Realization of formation of a functional film on an underlying layer while suppressing the effects of plasma, ions, electrons, etc. on the underlying layer so as to protect the layer from any damage.

(3) Realization of sputtering under high vacuum for formation of a high-quality film.

Industrialization of the aforementioned sputtering apparatus requires further improvements in terms of reliability, maintenance, and equipment cost. Since the sputtering apparatus has a structure in which a cooling jacket is provided at the interface between a support unit and a backing unit of the target, when the apparatus is operated for a long period of time, deterioration of a vacuum seal occurs with passage of time. Therefore, such a problem has remained unsolved.

SUMMARY OF THE INVENTION

In view of the foregoing, an object of the present invention is to provide an improved facing-targets-type sputtering apparatus.

Another object of the present invention is to provide a facing-targets-type sputtering apparatus which enables formation of a film having a uniform thickness in a width direction of a substrate even when a film is formed on a substrate having a high width/length ratio or when continuous film formation is performed while a substrate is conveyed at a predetermined rate.

Still another object of the present invention is to provide a facing-targets-type sputtering apparatus which enables uniform erosion of the entire surface of a target including corners thereof.

Yet another object of the present invention is to provide a facing-targets-type sputtering apparatus which enables suppression of heating of a substrate.

Yet another object of the present invention is to provide a facing-targets-type sputtering apparatus which enables protection of an underlying layer from any damage during the course of film formation.

Yet another object of the present invention is to provide a facing-targets-type sputtering apparatus in which confinement of plasma is improved so as to permit sputtering of a target under high vacuum, thereby forming a high-quality film.

Yet another object of the present invention is to provide a facing-targets-type sputtering apparatus which can be operated reliably over a long period of time, in which deterioration of a cooling jacket of a cooling unit with passage of time is prevented.

The aforementioned objects can be achieved by the present invention described hereinbelow. According to a first aspect of the present invention, there is provided a facing-targets-type sputtering apparatus comprising a sputtering unit comprising a pair of facing targets which are disposed a predetermined distance away from each other, and permanent magnets serving as magnetic-field generation means which are disposed around each of the facing targets, the permanent magnets being provided so as to generate a facing-mode magnetic field and a magnetron-mode magnetic field, the facing-mode magnetic field extending in the direction perpendicular to the facing targets in such a manner as to surround a confinement space provided between the targets, and the magnetron-mode magnetic field extending from the vicinity of a peripheral edge portion of each of the targets to a center portion thereof, thereby confining plasma within the confinement space by means of these magnetic fields for form ng a thin film on a substrate disposed beside the confinement space, which apparatus further comprises magnetic-field regulation means for regulating the magnetron-mode magnetic field. The magnetic-field regulation means is provided for attaining uniform erosion of a target and for regulating variation in film thickness in a width direction.

According to a second aspect of the present invention, there is provided a facing-targets-type sputtering apparatus comprising a sputtering unit comprising a pair of facing targets which are disposed a predetermined distance away from each other, and permanent magnets which are disposed along the periphery of each of the facing targets, the permanent magnets being provided so as to generate a magnetic field in the direction perpendicular to the facing targets in such a manner as to surround a confinement space provided between the targets, thereby confining plasma within the confinement space by means of the magnetic field for forming a film on a substrate disposed beside the confinement space, which apparatus further comprises a metallic backing unit provided on the back side of each of the targets; a metallic support unit comprising a receiving section for accommodating the backing unit and accommodation sections for accommodating the permanent magnets, the accommodation sections being provided in peripheral walls which define the receiving section; and a cooling jacket provided in the backing unit, the cooling jacket being closed excepting a port connected to a pipe, wherein the backing unit is accommodated in the receiving section such that the back surface of the backing unit is in direct contact with the support unit. Provision of the facing-targets-type sputtering apparatus can solve problems in terms of maintenance, reliability, and equipment cost.

According to a third aspect of the present invention, there is provided a facing-targets-type sputtering apparatus comprising a sputtering unit comprising a pair of facing targets which are disposed a predetermined distance away from each other, and permanent magnets which are disposed along the periphery of each of the facing targets, the permanent magnets being provided so as to generate a magnetic field in the direction perpendicular to the facing targets in such a manner as to surround a confinement space provided between the targets, thereby confining plasma within the confinement space by means of the magnetic field for forming a film on a substrate disposed beside the confinement space, which apparatus further comprises a yoke which magnetically connects magnetic poles of the permanent magnets that are located on the side opposite the confinement space (hereinafter the magnetic poles will be referred to as "open-side-facing magnetic poles").

In the facing-targets-type sputtering apparatus according to the first aspect of the present invention, plasma is confined within the confinement space by means of the aforementioned magnetic fields, and thus sputtering is effectively performed. Conceivably, plasma confined by means of the facing-mode magnetic field dominates sputtering of the center portion of the target, whereas plasma confined by means of the magnetron-mode magnetic field dominates sputtering of the peripheral portion of the target. The present inventors have performed extensive studies on the magnetron-mode magnetic field which is required for regulating variation in film thickness in a width direction of the substrate and which can be locally regulated, and have found that, when a permanent magnet serving as magnetic-field regulation means for regulating the magnetron-mode magnetic field is appropriately provided on the back side of the target at a position on its centerline parallel to the substrate such that the permanent magnet faces toward the direction of the magnetron-mode magnetic field, variation in film thickness in a width direction of the substrate can be regulated. The present invention has been accomplished on the basis of this finding.

Conceivably, the magnetic-field regulation means locally regulates the magnetron-mode magnetic field extending to a position at which the regulation means is provided and to the vicinity of the position (i.e., the vicinity of the surface of the target), thereby partially regulating the plasma confinement effects exerted by the magnetron-mode magnetic field and the facing-mode magnetic field in the vicinity of the surface of the target. Therefore, sputtering rate in the vicinity of the surface of the target can be locally regulated, to thereby regulate variation in film thickness. No particular limitation is imposed on the magnetic-field regulation means, so long as the regulation means can regulate the magnetron-mode magnetic field, specifically in terms of the distribution pattern of magnetic fluxes and/or intensity of the magnetic field. Therefore, instead of the permanent magnet which provides great regulation effects, a magnetic material of high magnetic permeability which can regulate the magnetic resistance of a magnetron-mode magnetic circuit may be employed as the magnetic-field regulation means. Needless to say, the direction of the magnetic field of the permanent magnet may be the same as or opposite that of the magnetron-mode magnetic field.

Regarding the second aspect of the present invention, the present inventors have performed studies on the aforementioned problems in relation to deterioration of a vacuum seal with passage of time, and have found that such problems arise as a result of deterioration of aluminum employed in a support section by cooling water. Therefore, in order to solve such problems, the present inventors have performed extensive studies, and have found that, when, in order to prevent deterioration of the vacuum seal, a closed cooling jacket is provided within a backing section so as to separate the vacuum seal from cooling water, and the backing section is brought into direct contact with the support section, cooling of the support section can be performed as in the case of the sputtering apparatus disclosed in the aforementioned publication without raising any problem. The present invention has been accomplished on the basis of this finding.

Through use of the facing-targets-type sputtering apparatus according to the third aspect of the present invention, a film can be formed at a low temperature as compared with the case where a conventional facing-targets-type sputtering apparatus is employed. The reasons for realization of such film formation will now be described.

As shown in FIG. 2, in a conventional facing-targets-type sputtering apparatus, rod-like or plate-like permanent magnets 130a and 130b having a predetermined length are disposed behind or around targets 110a and 110b, such that the N pole of the permanent magnet 130a faces the S pole of the permanent magnet 130b. Therefore, a facing-mode magnetic field represented by magnetic flux P is generated between the facing N and S poles in the direction perpendicular to the surfaces of the targets 110a and 110b in such a manner as to surround a confinement space 120. Also, when the permanent magnets 130a and 130b are provided around the targets 110a and 110b as shown in FIG. 2, magnetic fields represented by magnetic fluxes FA1 and FB1 extending from the N pole to the S pole of the permanent magnets 130a and 130b are generated, and arcuate magnetron-mode magnetic fields represented by magnetic fluxes HA and HB extending from the peripheral edges of the targets 110a and 110b to the center portions thereof are generated. Therefore, unlike the case of a conventional planar-magnetron-type sputtering apparatus, in the facing-targets-type sputtering apparatus, high-density plasma is generated at the center portion of the target by means of the facing-mode magnetic field, and at the peripheral edge of the target by means of the magnetron-mode magnetic field, whereby the entire surface of the target is almost uniformly sputtered at high rate. In addition, since the plasma is confined within the confinement space, plasma-free film formation can be performed.

Meanwhile, in addition to the facing-mode magnetic field and the magnetron-mode magnetic field generated within the confinement space 120 provided in the sputtering unit, as shown in FIG. 2, magnetic fields represented by magnetic fluxes FA2 and FB2 extending from the N pole to the S pole of the permanent magnets 130a and 130b, and a magnetic field represented by magnetic flux F3 extending from the open-side-facing N pole of the permanent magnet 130b to the open-side-facing S pole of the permanent magnetic 130a are generated. These magnetic fields represented by the magnetic fluxes FA2, FB2, and F3 have been considered not to affect confinement of plasma.

These magnetic fields represented by the magnetic fluxes FA2, FB2, and F3 which are generated outside the sputtering unit extend to the vicinity of the substrate or to the substrate. Therefore, low-energy thermoelectrons whose energy has been consumed through ionization, along with a portion of plasma which has not been confined within the confinement space, migrate to the substrate by means of these magnetic fields, to thereby raise the aforementioned problems; i.e., heating of the substrate and damage to an underlying layer.

In the sputtering apparatus of the present invention, a yoke is provided so as to magnetically connect the open-side-facing magnetic poles of the permanent magnets 130a and 130b. Specifically, as shown in FIG. 8, the open-side-facing magnetic poles of the permanent magnets 130a and 130b are substantially magnetically connected by use of a yoke 190 formed of a ferromagnetic material such as an iron plate, and a substantially closed magnetic circuit is formed. As shown in FIG. 8, the yoke 190 includes pole sections 19a and 191b formed of a ferromagnetic material for connecting the open-side-facing magnetic poles of the permanent magnetic 130a and 130b, and a connection section 192 formed of a ferromagnetic material for magnetically connecting the pole sections 191a and 191b so as to form a substantially closed magnetic circuit.

When such a yoke is provided, distribution of the magnetic fluxes of the aforementioned magnetic fields varies as described below. Specifically, in the below-described sputtering apparatus employed for film formation, as compared with a conventional sputtering apparatus including no yoke, the intensity of the facing mode magnetic field as measured at the substrate 20 mm distant from the lateral side of the sputtering unit increases by some tens of percent or more, and the intensity of an magnetic field outwardly extending from the peripheral edge of the confinement space 120 to the open-side-facing magnetic pole of each of the permanent magnets 130a and 130b decreases by some tens of percent. That is, when the yoke 190 is provided, the intensity of the facing-mode magnetic field surrounding the confinement space 120 increases greatly, whereby confinement of plasma is enhanced, and the intensity of the magnetic field outwardly extending from the peripheral edge of the confinement space 120 to the peripheral edge of the sputtering unit decreases considerably. As described above, confinement of plasma within the confinement space 120 is enhanced, and leakage of γ electrons and thermoelectrons to the outside of the confinement space 120 (i.e., leakage toward the substrate) is reduced. In addition, the intensities of the magnetic fields represented by the magnetic fluxes FA2, FB2, and F3 are reduced, and migration of thermoelectrons to the substrate by means of these magnetic fields is reduced.

Therefore, unlike the case of a conventional sputtering apparatus, low-temperature film formation is realized. When confinement of plasma is enhanced as described above, leakage of plasma containing high-energy particles to the substrate is reduced. Therefore, since damage to an underlying layer can be prevented, and sputtering can be performed under high vacuum, formation of a film of high quality is attained.

In the present invention, from the viewpoint of reliable connection of the open-side-facing magnetic poles of the permanent magnets, preferably, the yoke includes pole sections provided on the open-side-facing magnetic poles of the permanent magnets, the pole sections being formed of a ferromagnetic material, and a connection section which magnetically connects the pole sections, the connection section being formed of a ferromagnetic material. From the viewpoint of reduction of effects by the aforementioned outwardly extending magnetic fields, preferably, the yoke includes a plate-like connection section such that the connection section is provided at least at a side of the sputtering unit that faces the substrate while a portion of the sputtering unit that faces the substrate remains opened. Furthermore, from the viewpoint of reduction of leakage of magnetic field to the outside of the sputtering unit, preferably, all the sides of the sputtering unit are covered with plate-like members formed of a ferromagnetic material.

The foregoing and other objects of the present invention, together with its novel features, will become more apparent when the following detailed description is read with reference to the accompanying drawings.

DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 3:
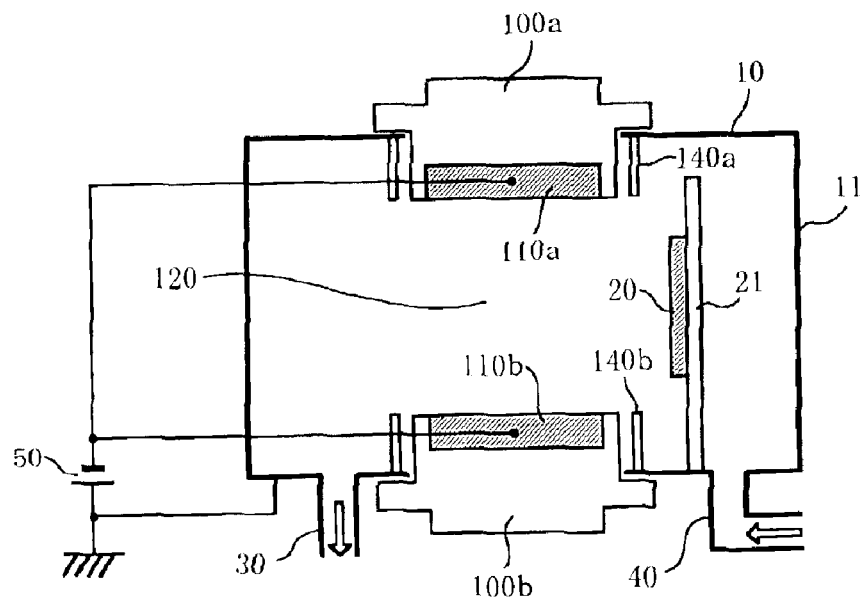
FIG. 3 is a schematic cross-sectional view showing the basic structure of a facing-targets-type sputtering apparatus according to a first embodiment of the present invention.
Figure 4:
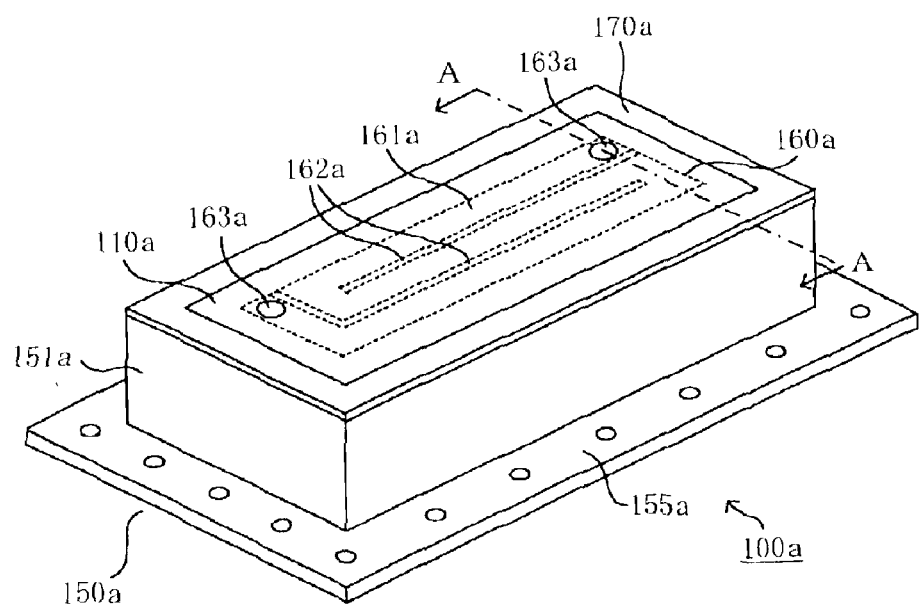
FIG. 4 is a schematic perspective view showing a target unit employed in embodiments of the present invention.
Figure 5:
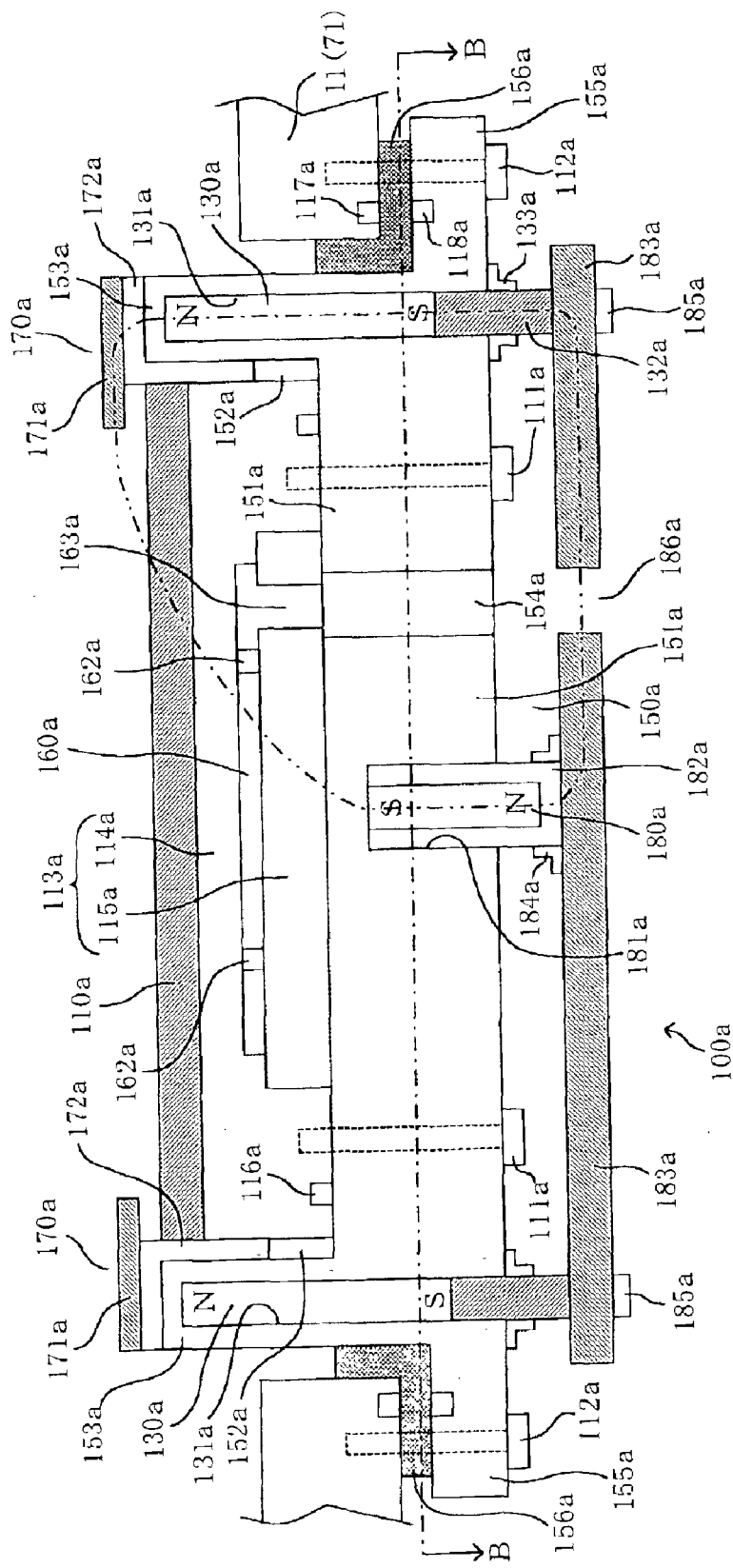
FIG. 5 is a schematic vertical cross-sectional view of the target unit shown in FIG. 4, as taken along line A—A.
Figure 6:
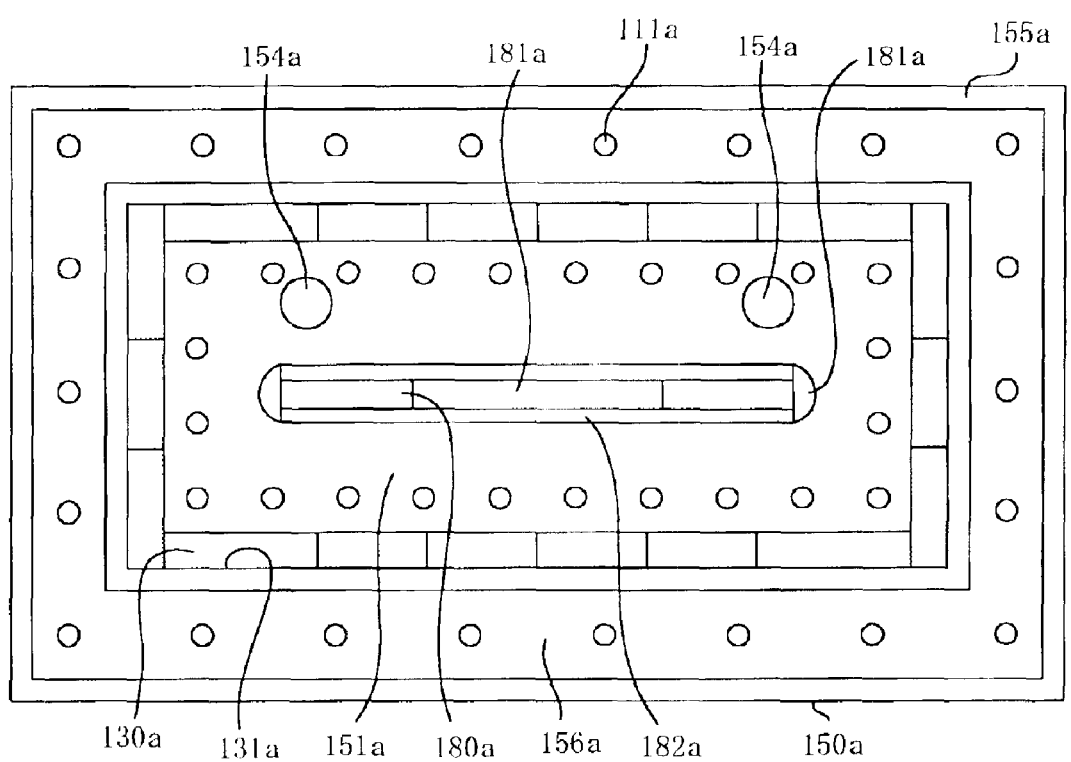
FIG. 6 is a schematic horizontal cross-sectional view of the target unit shown in FIG. 5, as taken along line B—B.

FIG. 3 is a schematic cross-sectional view showing a facing-targets-type sputtering apparatus according to a first embodiment of the present invention; FIG. 4 is a schematic perspective view showing a target unit employed in the sputtering apparatus shown in FIG. 3 according to the first embodiment of the present invention; FIG. 5 is a schematic vertical cross-sectional view of the target unit shown in FIG. 4, as taken along line A—A; and FIG. 6 is a schematic horizontal cross-sectional view of the target unit shown in FIG. 5, as taken along line B—B. The cross-section of a target unit 100a shown in FIG. 3 is shown in FIG. 5.

Figure 1:
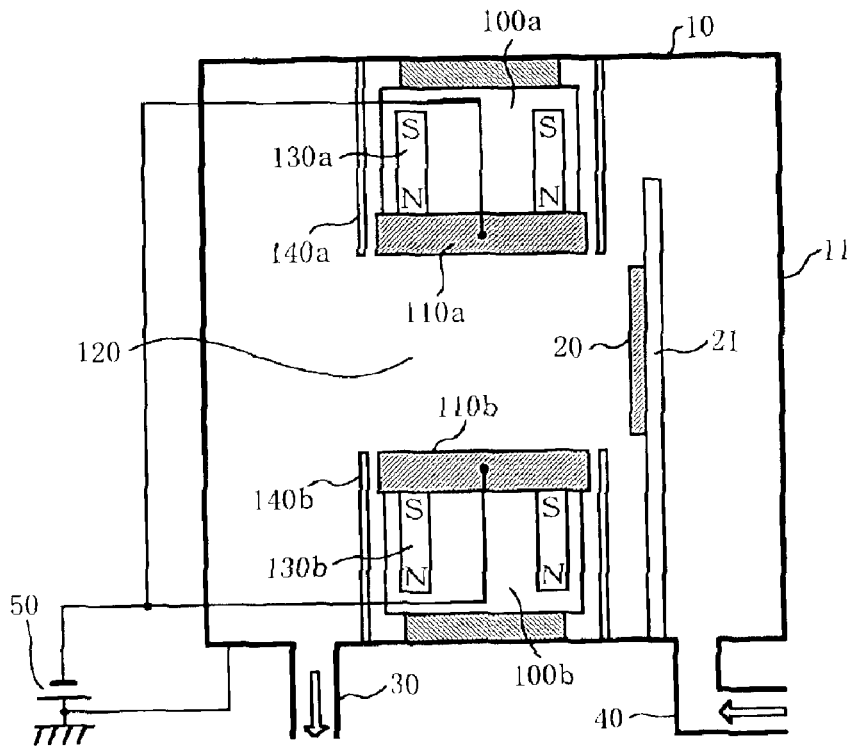
FIG. 1 is a schematic cross-sectional view showing the basic structure of a conventional facing-targets-type sputtering apparatus.

In FIG. 3, components corresponding to those in FIG. 1 are denoted by common reference numerals, and repeated description is omitted. The sputtering apparatus of the present embodiment differs from the conventional apparatus of FIG. 1 in the structure of target units 100a and 100b, and in that, in the sputtering apparatus of the present embodiment, openings are formed in two corresponding facing chamber walls 11 of a vacuum chamber 10 and the target units 100a and 100b are mounted to cover the openings. The target units 100a and 100b will next be described with reference to FIGS. 4 through 6.

As is clear from FIGS. 4 through 6, the basic structure of the target units 100a and 100b is the same as that of a target unit disclosed in Japanese Patent Application Laid-Open (kokai) No. 10-330936. As shown in FIGS. 4 through 6, the target units 100a and 100b are removably mounted on the chamber wall 11 of the vacuum chamber 10, or on a frame 71 which is described below in a second embodiment. FIGS. 4 through 6 show the structure of merely the target unit 100a. The target units 100a and 100b have the same structure, except that the N and S magnetic poles of permanent magnets serving as magnetic-field generation means and magnetic-field regulation means are reversed. Therefore, detailed drawings of the target unit 100b are omitted.

As shown in FIG. 4, the target unit 100a is detachably mounted on the chamber wall 11 of the vacuum chamber 10 by means of a flange 155a of a support unit 150a. As described below, the target unit 100a includes a support module, a target module, and a magnetic-field regulation module.

As shown in FIG. 5, the target module includes the target 110a, a backing unit 113a, and electron reflection means 170a, and the target module is exchangeably mounted, by means of bolts 111a arranged at certain intervals, on a receiving section 152a formed at the front side of the support unit 150a constituting the support module.

Unlike the case of the sputtering apparatus disclosed in Japanese Patent Application Laid-Open (kokai) No. 10-330936, in the present embodiment, a cooling jacket 160a is provided inside the backing unit 113a. Specifically, the cooling jacket 160a is formed as follows: a step-down hollow section having partitions 162a for forming a cooling trench 161a having a shape represented by a dotted line of FIG. 4 is formed in the back side of a plate-like backing main body 114a such that the size of the hollow section covers the target 110a as widely as possible; and a lid 115a having a connection port 163a which connects to the cooling trench 161a is welded to the step-down hollow section, to thereby close the hollow section. The backing section 113a and the partitions 162a are formed of a thermally conductive material (specifically, copper in the present embodiment). A synthetic-resin-made tube (not illustrated) is provided by way of holes 154a and 186a and connected to the connection port 163a by use of a connection tool such that cooling water flows through the cooling jacket 160a.

The target 110a is affixed to the front surface of the backing unit 113a by use of a thermally conductive adhesive material (specifically, indium in the present embodiment), and, as shown in FIG. 5, the electron reflection means 170a is mounted on the side wall of the backing unit 113a by means of bolts (not illustrated), to thereby form the target module. The electron reflection means 170a is formed of a magnetic material (specifically, an iron plate in the present embodiment) such that the means 170a can also serve as the magnetic pole of magnetic-field generation means. As shown in FIG. 5, the electron reflection means 170a includes an electron reflection plate 171a having a width so as to face the peripheral edge of the target 110a. The electron reflection plate 171a is provided so as to cover the front surface of a peripheral wall 153a of the support unit 150a in which the magnetic generation means is accommodated. The plate 171a is supported by a mounting section 172a having a reversed-L-shaped cross section and being formed of copper (i.e., thermally conductive material). Therefore, the electron reflection plate 171a is effectively cooled.

As shown in FIG. 5, the target module is mounted on the receiving section 152a formed at the front surface of the support main body 151a of the support unit 150a by means of the bolts 111a arranged at certain intervals, such that the back surface of the backing unit 113a is brought into direct contact with the surface of the receiving section 152a. In FIG. 5, reference numeral 116a denotes an O ring for vacuum sealing. By means of the O ring, vacuum sealing between the target module and the vacuum chamber 10 is attained. Since the cooling jacket 160a is sealed through welding, and sealing between the vacuum chamber 10 and the target module is maintained by means of the O ring 116a, leakage of cooling water into the vacuum chamber is prevented. In addition, since the support main body 151a is separated from the cooling jacket, deterioration of sealing performance caused by direct contact between the support main body 151a and cooling water can be prevented, whereby reliability and maintenance are improved. The support unit 150a may be formed of an inexpensive material such as aluminum.

The support module includes the support unit 150a, which is formed from a thermally conductive material (specifically, an aluminum block in the present embodiment) through machining. The flange 155a constituting the support unit 150a is mounted on the chamber wall 11 by means of bolts 112a arranged at certain intervals, via a packing 156a formed of an electrically insulating material (specifically, a heat-resistant resin in the present embodiment) and O rings 117a and 118a for vacuum sealing.

As shown in FIG. 4, the support unit 150a includes the support main body 151a having a rectangular parallelepiped shape, and the flange 155a having a predetermined width such that the flange can be mounted on the chamber wall 11. The receiving section 152a on which the target module is to be mounted is formed atop the support main body 151a, and an accommodation section 131a for accommodating a permanent magnet 130a serving as magnetic-field generation means is formed in the peripheral wall 153a surrounding the receiving section 152a. As described above, the electron reflection means 170a is provided on the front surface of the peripheral wall 153a. But in the case where the electron reflection means 170a is not provided, preferably, the peripheral wall 153a is provided so as to project into the interior of the vacuum chamber by a predetermined length as measured from the front surface of the target 110a, such that the magnetron-mode magnetic field is reliably generated in the vicinity of the peripheral edge of the target 110a even when the target 110a is formed of a magnetic material.

As shown in FIGS. 5 and 6, the accommodation section 131a has an outwardly opened hole of a predetermined depth such that the permanent magnet 130a serving as the magnetic-field generation means can be placed thereinto from the outside of the vacuum chamber. The plate-like permanent magnet 130a of predetermined length and width is placed into the hole of the accommodation section 131a such that the magnetic poles are arranged as shown in FIG. 5, and the permanent magnet 130a is fixed by means of fixing members 133a of L-shape cross section and bolts (not illustrated) via a plate-like core member 132a formed of a magnetic material. A predetermined number of the permanent magnets 130a are provided so as to surround the target 110a.

Thus, complete sealing between the permanent magnet 130a and the vacuum chamber 10 is maintained, and the permanent magnet 130a is thermally connected to the cooling jacket 160a via the backing section 113a and the thermally conductive support main body 151a with which the permanent magnet 130a is in direct contact. Therefore, the permanent magnet 130a is effectively cooled. Thus, contamination of the vacuum chamber 10 with impurity gasses from the permanent magnet 130a (such a problem has arisen in a conventional sputtering apparatus) is prevented, and deterioration of the permanent magnet 130a with passage of time is considerably reduced, resulting in improved reliability, long-term stability, and maintenance. In this sputtering apparatus, there are obtained cooling effects substantially equal to those obtained by a conventional sputtering apparatus in which a cooling jacket is provided at the interface between a support main body and a backing section.

As disclosed in the aforementioned publication, the permanent magnet 130a and the permanent magnet provided in the target unit 100b (not illustrated) generate the magnetic fields for confinement of plasma; i.e., the facing-mode magnetic field extending in the direction perpendicular to the targets 110a and 110b in such a manner as to surround the confinement space 120, and the arcuate magnetron-mode magnetic field extending from the inner edge of the electron reflection plate 171a, the inner edge facing the target 110a, toward the center portion of the target 110a. The facing-mode magnetic field dominates sputtering of the center portion of the target 110a, whereas the magnetron-mode magnetic field dominates sputtering of the peripheral portion of the target 110a. As a result, the entire surface of the target is almost uniformly sputtered, as compared with the case of a typical conventional sputtering method; i.e., a planar-magnetron-type sputtering method.

In the present embodiment, magnetic-field regulation means for regulating variation in the thickness of a thin film to be formed on the substrate, particularly variation in film thickness in a width direction, is provided as described below. A trench 181a of predetermined depth and width is provided on the back side of the support main body 151a of the support unit 150a, at a position on the centerline of the main body 151a parallel to the substrate. The trench 181a is provided for mounting therein auxiliary magnets 180a serving as the magnetic-field regulation means, the magnets 180a being formed of a permanent magnet. In the present embodiment, the trench 181a is provided so as to extend in the width direction of the target 110a such that the position of the magnetic-field regulation means can be readily regulated in accordance with change of the sputtering connditions, for example, the materials of the target 110a. As described below, the magnetic-field regulation module is provided on the back side of the support unit 150a such that the plate-like auxiliary magnets (permanent magnet) 180a of predetermined length, serving as the magnetic-field regulation means, are disposed at both ends of the trench 181a as shown in FIG. 6.

As shown in FIG. 5, the magnetic-field regulation module includes a support section 182a having a U-like cross section, the mounting section 183a being formed of a rectangular plate having a size nearly equal to that of the support main body 151a and the plate-like auxiliary magnet 180a fitted in the section 182a. The support section 182a is mounted on a mounting section 183a at a position on the centerline thereof parallel to the width direction of the substrate, by means of bolts (not illustrated) via fixing members 184a having a L-like cross section. The mounting section 183a is mounted on the core member 132a by means of bolts 185a. In FIG. 5, reference numeral 186a denotes a through hole for a cooling pipe.

As shown by a one-dot chain line of FIG. 5, the magnetron-mode magnetic field extends from the N pole of the permanent magnet 130a serving as the magnetic-field generation means, via the electron reflection plate 171a and the target 110a, to the S pole of the auxiliary magnet 180a serving as the magnetic-field regulation means. Furthermore, the magnetron-mode magnetic field extends from the N pole of the auxiliary magnet 180a, via the mounting section 183a and the core member 132a, to the S pole of the permanent magnet 130a. Meanwhile, when the auxiliary magnet 180a is not provided, the magnetron-mode magnetic field extends from the N pole of the permanent magnet 130a to the S pole thereof.

Unlike the case of a conventional sputtering apparatus including no magnetic-field regulation means, the magnetron-mode magnetic field extending in the vicinity of the front surface of the target 110a is locally regulated by means of the magnetic-field regulation means at the position at which the regulation means is provided and in the vicinity of the position. Therefore, the magnetron-mode magnetic field can be appropriately regulated at predetermined positions on the target in the width direction of the substrate, thereby enabling regulation of variation in the thickness of a thin film in the width direction, the film being formed as described below.

Conceivable reasons why such effects are obtained by means of the magnetic-field regulation means are described below. As shown in FIG. 5, by means of the magnetic-field regulation means, the magnetron-mode magnetic field extends to the center portion of the target. Therefore, interaction between the facing-mode magnetic field and the magnetron-mode magnetic field becomes strong in the vicinity of the position at which the magnetic-field regulation is provided. As a result, confinement of plasma is locally enhanced, and sputtering rate (i.e., film thickness) is locally regulated. When the intensity of the magnetron-mode magnetic field is regulated, interaction between the facing-mode magnetic field and the magnetron-mode magnetic field is also regulated. Therefore, local regulation of sputtering rate can be attained. The extension direction and intensity of the magnetron-mode magnetic field are appropriately determined ill accordance with purposes for sputtering.

When the sputtering apparatus of the present embodiment is employed, the entire surface of the target is uniformly eroded. As described above, when a conventional sputtering apparatus is employed, the degree of erosion of a first pair of diagonal corners of a rectangular target somewhat differs from that or a second pair of diagonal corners of the target. In contrast, when the sputtering apparatus is employed, by virtue of the magnetic-field regulation means, such difference does not arise, and, as described below, utilization efficiency of the target is enhanced by about 10%. This effect greatly contributes to reduction of film formation costs and realization of mass-production.

No particular limitation is imposed on the magnetic-field regulation means, so long as the regulation means can regulate the magnetron-mode magnetic field for confining plasma in the vicinity of the front surface of the target 110a. Therefore, the magnetic-field regulation means may be formed of, instead of a permanent magnet, a magnetic material of high magnetic permeability. The position at which the magnetic-field regulation means is provided and the intensity of a magnet to be employed are affected by various factors, including the material of the target and the size and arrangement of units provided around the target. Therefore, preferably, the position of the magnetic-field regulation means, etc. are determined on the basis of test data and simulation using the data.

In the present embodiment, from the viewpoint of stabilization of the aforementioned magnetic circuit, the support section 182a and the mounting section 183a are formed from a magnetic material of high magnetic permeability (specifically an iron material), and the mounting section 183a is formed of a plate-like body. However, depending on the size and arrangement of the target unit, these sections 182a and 183a are not necessarily formed from a magnetic material, so long as the auxiliary magnet 180a can be mounted in the trench 181a as shown in FIG. 5 by means of these sections 182a and 183a.

As described above, the entirety of the target unit 100a is provided on the support unit 150a. The flange 155a of the target unit 100a is mounted on the chamber wall 11 of the vacuum chamber 10 by means of the electrically-insulating-material-made bolts 112a arranged at certain intervals, via the packing 156a formed of an electrically insulating material (specifically a heat-resistant resin), and the O rings 117a and 118a for vacuum sealing. Therefore, as shown in FIG. 3, the target unit 100a is mounted on the chamber wall 11 of the vacuum chamber 10 in an electrically insulating manner. Instead of the electrically insulating bolts 112a, an electrically insulating bush may be employed, to thereby attain electrical insulation between the support unit 150a and the chamber wall 11. As shown in FIG. 3, a sputtering power supply is connected to appropriate positions of the chamber wall 11 and the support unit 150a, to thereby supply sputtering power between the vacuum chamber 10 and the targets 110a and 110b. As is clear from FIG. 3, as compared with a conventional sputtering apparatus, the facing-targets-type sputtering apparatus of the present embodiment has a compact structure, and the vacuum chamber has a simple structure, and thus maintenance of the apparatus is improved. In addition, since the capacity of the vacuum chamber is small, the time required for evacuation of the chamber is reduced, resulting in high productivity.

Second Embodiment

Figure 7A:
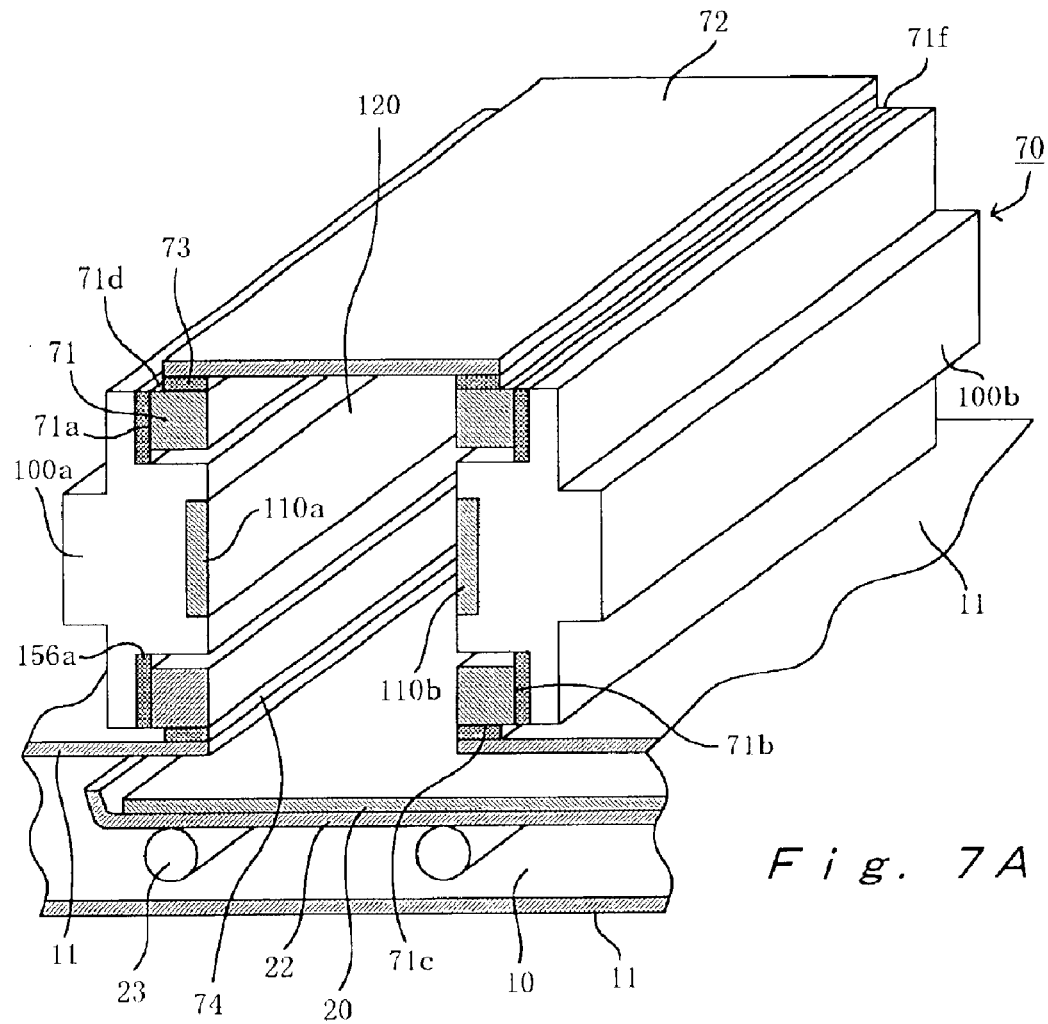
FIG. 7A is a schematic perspective view showing a facing-targets-type sputtering apparatus according to a second embodiment of the present invention.
Figure 7B:
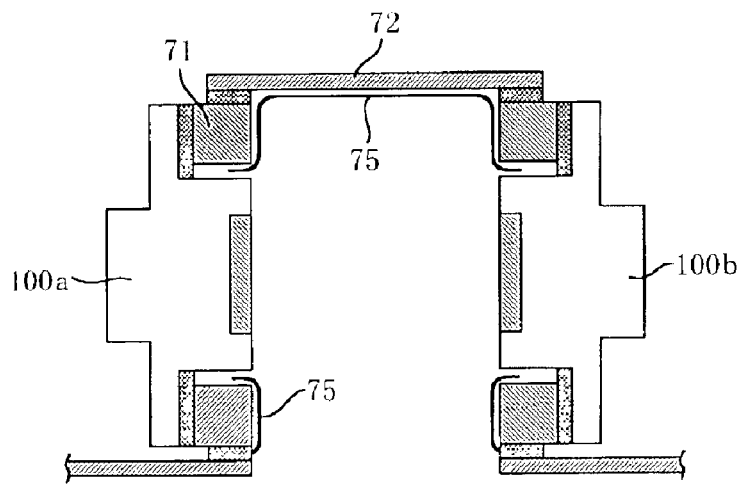
FIG. 7B is a schematic vertical cross-sectional view showing the sputtering apparatus according to the second embodiment of the present invention.

FIG. 7A is a schematic perspective view showing a facing-targets-type sputtering apparatus according to a second embodiment of the present invention; and FIG. 7B is a schematic cross-sectional view of the sputtering unit of the sputtering apparatus. Unlike the case where the target units 100a and 100b are mounted on the vacuum wall 11 of the vacuum chamber 10 as shown in FIG. 3, in the present embodiment, the target units 100a and 100b are mounted on opposing faces 71a and 71b of a rectangular parallelepiped frame 71, respectively, and faces 71d through 71f (a face 71e is not illustrated), excluding a face 71c which faces a substrate, are covered by use of closure plates, to thereby form a box-like unit 70. Since the facing-targets-type sputtering apparatus has a compact structure, maintenance of the apparatus is improved. In addition, the apparatus is suitable for mass-production at high productivity.

As shown in FIGS. 7A and 7B, the box-like unit 70 includes the rectangular parallelepiped frame 71 formed of aluminum. The target units 100a and 100b shown in FIGS. 4 through 6 are mounted on the faces 71a and 71b of the frame 71, respectively, such that the target units are electrically insulated from the frame 71. Closure plates 72 (closure plates 72 corresponding to the faces 71e and 71f are not illustrated) are mounted on the faces 71d through 71f, excluding the face 71c which faces a substrate 20, by means of bolts (not illustrated) and via packings 73 formed of a heat-resistant resin and O rings (not illustrated). No particular limitation is imposed on the material of the closure plates 72, so long as the plates 72 exhibit heat resistance, and vacuum sealing is attained by means of the plates 72. Therefore, the closure plates 72 may be formed of a typical structural material. In the present embodiment, the closure plates 72 are formed of aluminum, which is employed for forming the frame 71. The frame 71 and the closure plates 72 are electrically connected by means of bolts. If desired, a cooling tube is provided outside the closure plates 72, to thereby cool the plates 72.

As shown in FIG. 7A, the box-like unit 70 is mounted on the chamber wall 11 of the vacuum chamber 10 by means of bolts (not illustrated) and via packings 74 formed of a heat-resistant resin and O rings (not illustrated) in a manner similar to that described with reference to FIGS. 3 and 4, such that the face 71c of the frame 71 faces the substrate. The vacuum chamber 10 and the frame 71 are electrically connected by means of bolts. The facing-targets-type sputtering apparatus of the present embodiment has a structure such that film formation is performed while the substrate 20 is conveyed. Although not illustrated in FIG. 7A, a known substrate feed chamber and a known substrate removal chamber are connected to the vacuum chamber 10, so that film formation can be performed while the substrate 20 placed on a tray 22 is conveyed at a predetermined rate. In FIG. 7A, reference numeral 23 denotes a roller for conveying the tray 22; i.e., the substrate 20.

In the box-like unit 70, the facing targets 110a and 10b are disposed a predetermined distance away from each other, and the magnetic fields for confining plasma are generated as in the case of the sputtering apparatus shown in FIG. 3. Therefore, when a sputtering power supply is connected to the chamber wall 11 of the vacuum chamber 10 serving as a cathode and to the target units 100a and 100b serving as an anode, and sputtering power is supplied, sputtering of the targets is performed. In the sputtering apparatus of the present embodiment, since all sides of the confinement space 120, excepting the face 71c facing the substrate, are covered by the closure plates, sputtered particles migrate merely through the opening (i.e., the face 71c) toward the substrate 20 provided in the vacuum chamber 10. Therefore, as compared with the case of the side-opened-type sputtering target shown in FIGS. 1 and 3, flying of sputtered particles to a portion other than the substrate within the vacuum chamber 10 is reduced, and thus utilization efficiency of the target and maintenance of the apparatus are improved.

As is clear from FIG. 7A, when the box-like unit 70 is employed, the size of the vacuum chamber 10 for accommodating the substrate 20 is greatly reduced, and therefore, equipment costs and the time required for evacuation of the chamber are reduced; i.e., equipment operation efficiency is improved, resulting in high productivity.

As shown in FIG. 7B, net-like members 75 formed of a metal (e.g., copper), serving as particle holding means, are mounted on all the interior walls of the box-like unit 70 including the frame 71 and the closure plates 72, excepting the target surfaces, by means of bolts. The net-like members 75 may be sandwiched between the corresponding units of the box-like unit. When the net-like members 75 are provided, exfoliation of a thin film—formed through long-term deposition of sputtered particles on the frame 71 and the closure plates 72—from the interior walls of the box-like unit 70 is prevented, and thus abnormal discharging and deterioration of the quality of a final product, which are caused by falling of the exfoliated fragments of the film, are prevented, thereby attaining long-term reliable operation and improvement of the quality of a final product. The mesh size of the net-like member relates with the material of a film to be formed, and the mesh size is preferably determined on the basis of test data. So long as the mesh size is 10 to 100 mesh, the object may be achieved generally.

All the closure plates 72 or the closure plate 72 provided on the face 71d that faces the substrate 20 may be replaced with a target unit obtained through removal of the permanent magnets 130a and 180a from the target unit 100a shown in FIGS. 4 through 6. When the closure plate 72 is replaced with a target unit including no magnet, the aforementioned net-like member is not mounted on the target unit.

Third Embodiment

Figure 8:
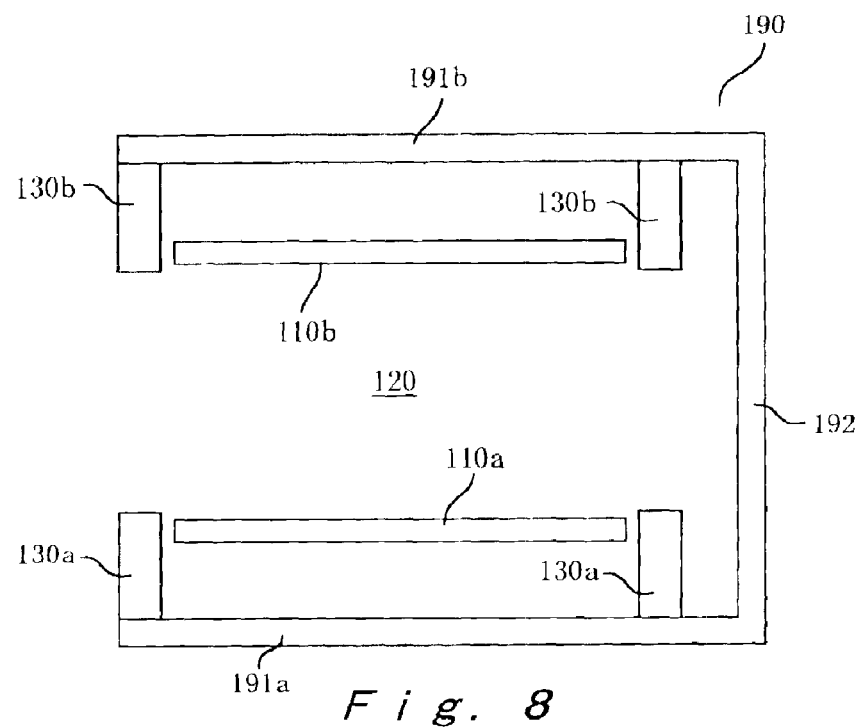
FIG. 8 is a schematic cross-sectional view showing the basic structure of a facing-targets-type sputtering apparatus according to a third embodiment of the present invention.
Figure 9:
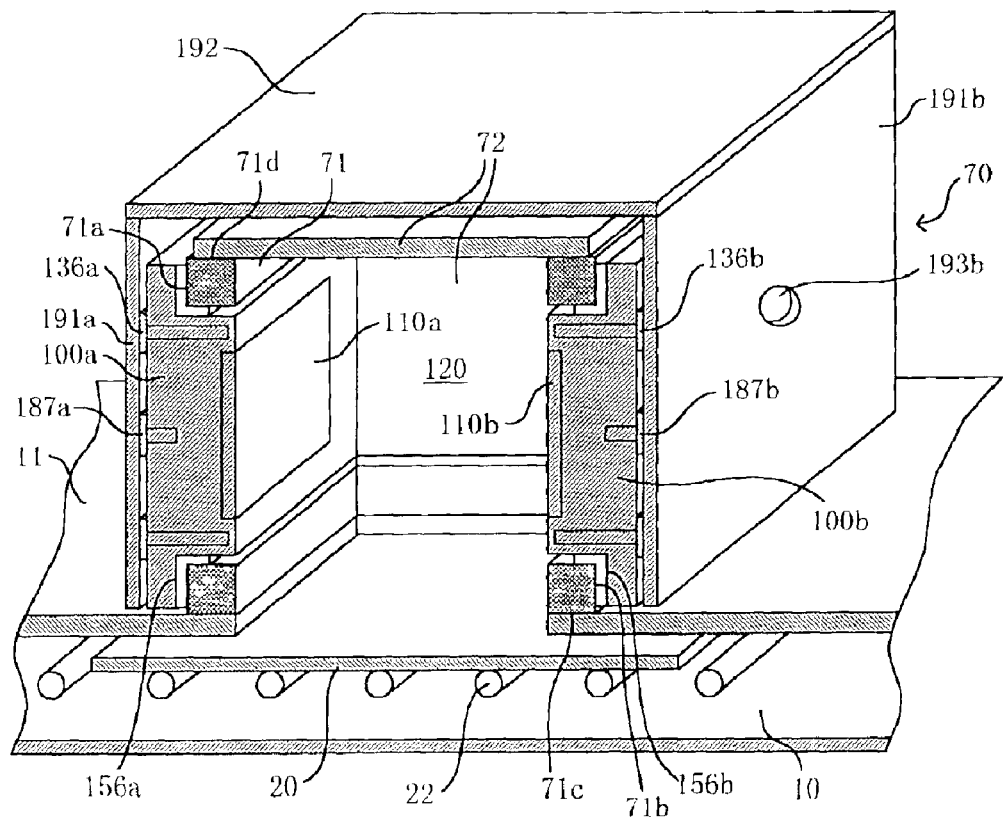
FIG. 9 is a schematic perspective view showing the sputtering apparatus according to the third embodiment of the present invention.

FIG. 8 is a schematic cross-sectional view showing the basic structure of a facing-targets-type sputtering apparatus according to a third embodiment of the present invention; and FIG. 9 is a schematic perspective view showing the sputtering apparatus according to the third embodiment including a box-like unit. Unlike the case where the target units 100a and 100b are mounted directly on the vacuum wall of the vacuum chamber, in the present embodiment, as in the case of the sputtering unit of the second embodiment, the target units 100a and 100b are hermetically mounted on opposing faces 71a and 71b (see FIG. 9) of a rectangular parallelepiped frame 71, respectively, and faces 71d through 71f (a face 71e located at the front side and a face 71f located at the back side are not illustrated), excluding a face 71c which faces a substrate, are hermetically covered by use of closure plates 72, to thereby form a box-like unit 70. The box-like unit 70 is mounted on the chamber wall 11 of the vacuum chamber 10 via O rings, such that the face 71c of the frame 71 faces the substrate. Since the facing-targets-type sputtering apparatus has a compact structure, maintenance of the apparatus is improved. In addition, the apparatus is suitable for mass-production at high productivity.

Figure 10:
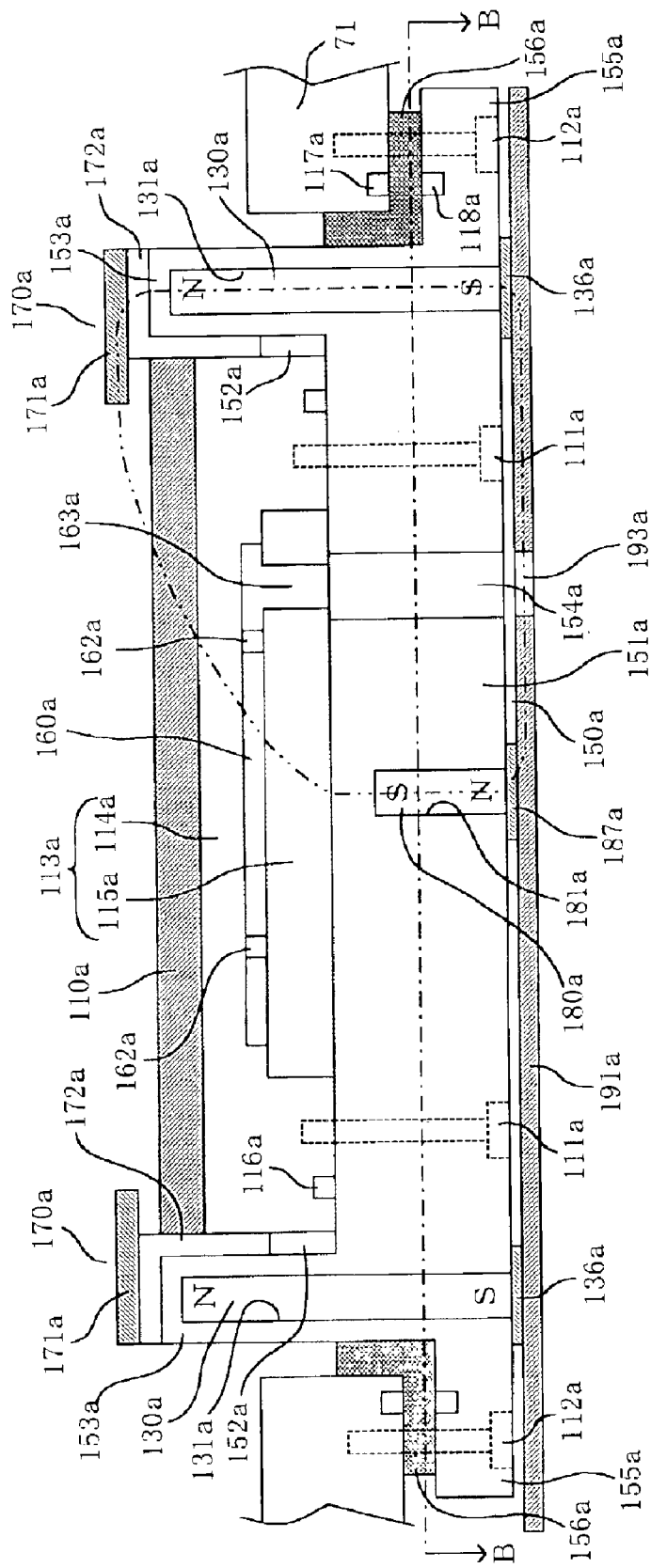
FIG. 10 is a vertical cross-sectional view of the target unit shown in FIG. 4, as taken along line A—A, the target being employed in the third embodiment.
Figure 11:
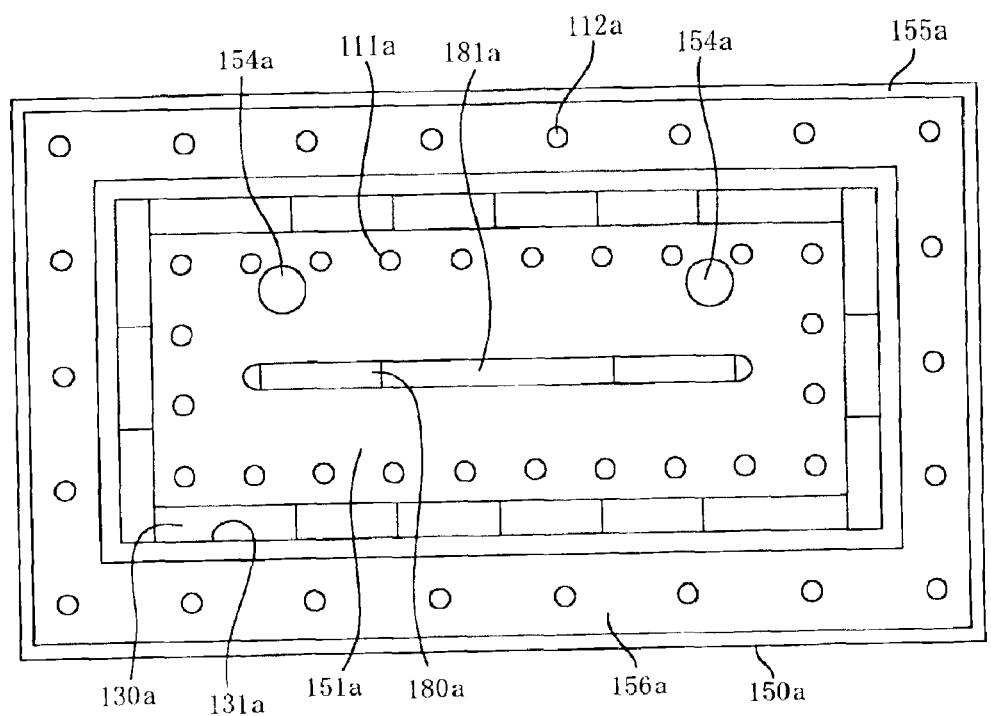
FIG. 11 is a schematic horizontal cross-sectional view of the target unit shown in FIG. 10, as taken along line B—B.

The perspective view of the target unit employed in the sputtering apparatus of the third embodiment shown in FIG. 9 is shown in FIG. 4. FIG. 10 is a vertical cross-sectional view of the target unit shown in FIG. 4, as taken along line A—A, the target unit being employed in the third embodiment; and FIG. 11 is a schematic horizontal cross-sectional view of the target unit shown in FIG. 10, as taken along line B—B. The target units 100a and 100b will be described in detail with reference to FIGS. 4, 10, and 11.

As is clear from FIGS. 4, 10, and 11, the basic structure of the target units 100a and 100b is the same as that of a target unit disclosed in Japanese Patent Application Laid-Open (kokai) No. 10-330936, excepting the magnetic-field regulation means. As shown in FIGS. 4, 10, and 11, the target units 100a and 10 Db are removably mounted on the frame 71. FIGS. 4, 10, and 11 show the structure of merely the target unit 100a. The target units 100a and 100b have the same structure, except that the N and S magnetic poles of permanent magnets serving as magnetic-field generation means and magnetic-field regulation means are reversed. Therefore, detailed drawings of the target unit 100b are omitted. The target unit 100a of the present embodiment has substantially the same structure as that of the second embodiment which has been described with reference to FIGS. 4 through 6. Therefore, common features are denoted by common reference numerals, and repeated description is omitted.

In the present embodiment, as described below, the target unit 100a includes a support module and a target module.

A synthetic-resin-made tube (not illustrated) is provided by way of holes 154a and 193a and connected to the connection port 163a—which is connected to the cooling jacket 160a formed in the backing unit 113a—by use of a connection tool such that cooling water flows through the cooling jacket 160a.

No particular limitation is imposed on the electron reflection plate 171a, so long as the plate 171a reflects electrons approaching the front surface of the permanent magnet 130a provided outside the target 110a (i.e., the front surface of the peripheral wall 153a). In some cases, the plate 171a may be sputtered. Therefore, preferably, the plate 171a is formed of the same material as the target 110a. When the plate 171a is formed of a non-magnetic material, as in the case where the electron reflection means is not provided, the permanent magnet 130a is preferably provided such that the N pole of the magnet 130a projects into the interior of the vacuum chamber by a predetermined length as measured from the front surface of the target 110a.

As shown in FIG. 10, the permanent magnet 130a having a height equal to the depth of the accommodation section 131a is provided in the accommodation section 131a formed in the peripheral wall 153a of the support unit 150a, such that the magnetic poles of the magnet 130a are arranged as shown in FIG. 10. In the present embodiment, the permanent magnet 130a is formed of a commercially available plate-like permanent magnet (e.g., AlNiCo magnet) of predetermined length and width. As shown in FIG. 10, a predetermined number of the permanent magnets 130a are provided so as to surround the target 110a. In the present embodiment, the permanent magnet 130a is fixed to the accommodation section by means of an electrically insulating material (specifically, a fixation plate 136a formed of a thin resin plate).

Figure 2:
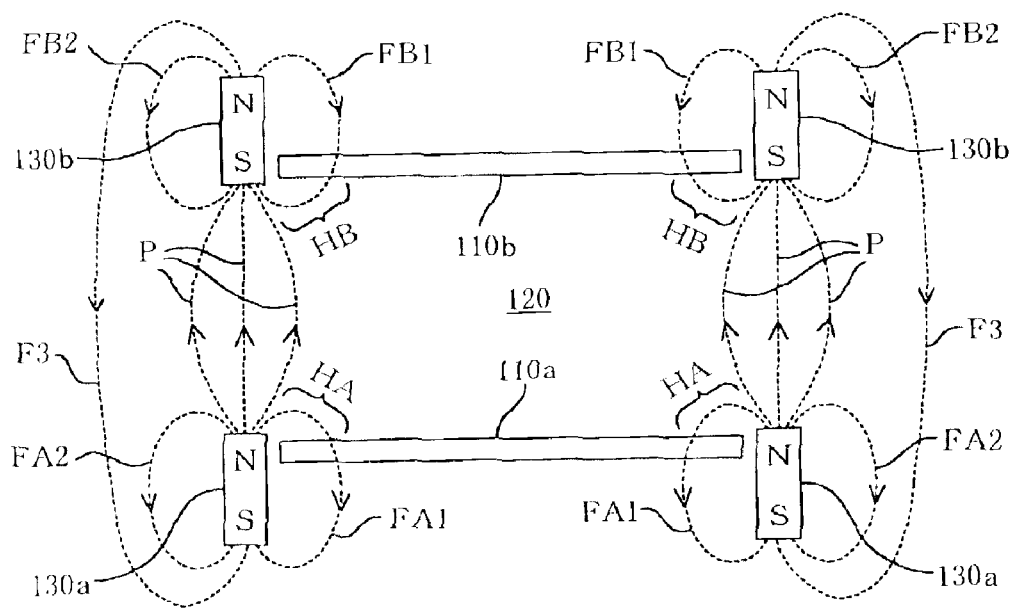
FIG. 2 shows distribution of the magnetic fluxes of magnetic fields in a conventional facing-targets-type sputtering apparatus.

As shown in FIG. 2, the permanent magnet 130a and the permanent magnet 130b provided in the target unit 100b generate magnetic fields for confinement of plasma; i.e., the facing-mode magnetic field P extending in the direction perpendicular to the targets 110a and 110b in such a manner as to surround the confinement space 120, and the arcuate magnetron-mode magnetic fields HA and HB extending from the inner edge of the electron reflection plate 171a, the inner edge facing the target 110a, toward the center portion of the target 11a. The facing-mode magnetic field P effects sputtering of the center portion of the target 110a, and the magnetron-mode magnetic field HA and HB effect sputtering of the peripheral portion of the target 110a. As a result, the entire surface of the target is almost uniformly sputtered, as compared with the case of a typical conventional sputtering method; i.e., a planar-magnetron-type sputtering method.

In the present embodiment, an auxiliary magnet serving as magnetic-field regulation means for regulating the magnetron-mode magnetic fields HA and HB is provided as described below. A trench 181a of predetermined depth and width is provided on the back side of the support main body 151a of the support unit 150a at a position on the centerline of the main body 151a that is parallel to the substrate. The trench 181a is provided for mounting therein auxiliary magnets 180a serving as the magnetic-field regulation means, the magnets 180a being formed of a permanent magnet. In the present embodiment, the trench 181a is provided so as to extend in the width direction of the target 111a such that the position of the magnetic-field regulation means can be readily regulated in accordance with change in, for example, the materials employed in the target 110a, and such that the entire magnetron-mode magnetic field is regulated by providing the magnetic-field regulation means so as to extend in the width direction. As shown in FIG. 11, the plate-like auxiliary magnets (permanent magnet) 180a of predetermined length, serving as the magnetic-field regulation means, are disposed at the both ends of the trench 181a. The auxiliary magnets 180a are fixed to the trench 181a by means of a fixation plate 187a formed of a thin resin plate. In the present embodiment, as shown in FIG. 10, the auxiliary magnet 180a and the permanent magnet 130a are magnetically connected to a pole section 191a of the below-described yoke 190, via the fixation plates 136a and 187a.

As shown by a two-dot chain line of FIG. 10, the magnetron-mode magnetic field extends from the N pole of the permanent magnet 130a serving as the magnetic-field generation means, via the electron reflection plate 171a and the target 110a, to the S pole of the auxiliary magnet 180a serving as the magnetic-field regulation means. Furthermore, the magnetron-mode magnetic field extends from the N pole of the auxiliary magnet 180a, via the fixation plate 187a, the pole section 191a, and the fixation plate 136a, to the S pole of the permanent magnet 130a. Meanwhile, when the auxiliary magnet 180a is not provided, the magnetron-mode magnetic field extends from the N pole of the permanent magnet 130a to the S pole thereof.

The magnetic-field regulation means can regulate the intensity of the magnetron-mode magnetic field, independently with the magnetic-field generating means. As described below, when the magnetic-field regulation means is employed in combination with the yoke, the regulation means exerts remarkable effects of optimizing distribution of the magnetic fluxes of the facing-mode and magnetron-mode magnetic fields for confinement of plasma.

As shown in FIG. 9, the box-like unit 70 includes the rectangular parallelepiped frame 71 formed of aluminum. The aforementioned target units 100a and 100b are hermetically mounted on the faces 71a and 71b of the frame 71, respectively, such that the target units are electrically insulated from the frame 71. Closure plates 72 (a closure plate 72 corresponding to the face 71e is not illustrated) are hermetically mounted on the faces 71d through 71f, excluding the face 71c which faces a substrate 20, by means of bolts (not illustrated) and via O rings (not illustrated). The closure plates 72 are electrically connected to the frame 71, and the frame 71 is electrically connected to the chamber wall 11. Therefore, the closure plates 72 are electrically connected to the chamber wall 11. No particular limitation is imposed on the material of the closure plates 72, so long as the plates 72 exhibit heat resistance and vacuum sealing is attained by means of the plates 72. Therefore, the closure plates 72 may be formed of a typical structural material. In the present embodiment, the closure plates 72 are formed of aluminum, which is employed in the frame 71. If desired, a cooling tube is provided outside the closure plates 72, to thereby cool the plates 72.

The facing-targets-type sputtering apparatus of the present embodiment has a structure such that film formation is performed while the substrate 20 is conveyed. Although not illustrated in FIG. 9, a known substrate feed chamber and a known substrate removal chamber are connected to the vacuum chamber 10, so that film formation can be performed while the substrate 20 is conveyed by means of conveying rollers 22 at a predetermined rate.

As shown in FIG. 9, the box-like unit 70 includes the yoke 190. The yoke 190 includes rectangular pole sections 191a and 191b formed of a ferromagnetic material (specifically, an iron plate in the present embodiment), and a connection section 192 formed of an iron plate for magnetically connecting the pole sections 191a and 191b. The pole section 191a is provided on the fixation plates 136a and 187a so as to cover the entire back face of the target unit 100a, and the pole section 191b is provided on the fixation plates 136b and 187b so as to cover the entire back face of the target unit 100b. In the present embodiment, each of the pole sections 191a and 191b extends beyond the upper face of the closure plate 72 mounted on the face 71d, and the connection section 192 is connected to both upper ends of the pole sections 191a and 191b. The pole sections 191a and 191b and the connection section 192 can be mounted on the box-like unit in a sufficiently strong manner by means of magnetic forces of the permanent magnets 130a and 130b. However, in the present embodiment, from the viewpoint of safety, the sections 191a, 191b, and 192 are fixed to the box-like unit by means of unillustrated screws.

In the aforementioned sputtering apparatus, the pole sections 191a and 191b are electrically insulated from the back surfaces of the target units 100a and 100b. Therefore, when the yoke 190 is electrically grounded, all the sides which are present outside the vacuum chamber 10 are electrically grounded. The sputtering apparatus of the present embodiment has a safe and simple structure, and is readily and practically applied to an existing box-like unit. As described below, various modifications of the sputtering apparatus may be made in accordance with intended purposes.

From the viewpoint of reduction of leakage of magnetic field to the substrate, preferably, the plate-like connection section 192 having an opening is provided on the face 71c facing the substrate so as to connect the pole sections 191a and 191b. This structure is preferred from the viewpoint of protection of an underlying layer from any damage. When this structure is constructed, the connection section is inserted between the chamber wall 11 and the frame 71 and fixed. In the present invention, no particular limitation is imposed on the yoke, so long as the yoke can magnetically connect the open-side facing magnetic poles of the permanent magnets 130a and 130b that are opposite the facing magnetic poles thereof, to thereby form a substantially closed magnetic circuit. Therefore, the pole section and the connection section are not necessarily formed of a plate-like body capable of covering each face of the frame, and a small air-gap may be present between the magnetic poles and the pole section, or between the pole section and the connection section.

In the box-like unit 70, the facing targets 110a and 110b are disposed a predetermined distance away from each other, and the magnetic fields for confining plasma are generated as shown in FIG. 2. Therefore, when a sputtering power supply is connected to the chamber wall 11 of the vacuum chamber 10 serving as an anode and to the target units 100a and 100b serving as a cathode, and sputtering power is supplied, sputtering of the targets is performed as in the case of a conventional sputtering apparatus.

In the sputtering apparatus of the present embodiment, since all the sides of the confinement space 120, excepting the face 71c facing the substrate, are covered by the closure plates, sputtered particles migrate merely through the opening (i.e., the face 71c) toward the substrate 20 provided in the vacuum chamber 10. Therefore, as compared with the case of a conventional side-opened-type sputtering target in which the sides of the confinement space are opened, flying of sputtered particles to a portion other than the substrate within the vacuum chamber 10 is reduced, and thus utilization efficiency of the target and maintenance of the apparatus are improved. Even in the case where a plurality of the box-like units 70 are arranged, when intervals therebetween are regulated to some cm or more, interaction between the box-like units can be prevented, and thus formation of a multi-layer film can be attained by means of the sputtering apparatus of compact structure. As is clear from FIG. 9, unlike the case of a conventional sputtering apparatus, in the sputtering apparatus of the present embodiment, the sputtering unit has a box-like compact structure, and is provided outside the vacuum chamber 10. Therefore, since the vacuum chamber 10 accommodates and conveys only the substrate, the size of the vacuum chamber is greatly reduced, and thus maintenance of the apparatus is improved. In addition, since the capacity of the vacuum chamber is reduced, the time required for evacuation of the chamber is reduced; i.e., equipment operation efficiency is improved, resulting in reduction of equipment costs and improvement of productivity.

In the present embodiment, the yoke 190 is provided. Therefore, as compared with the case of a conventional sputtering apparatus including no yoke, the intensity of the facing-mode magnetic field increases, and the intensity of the magnetic field extending from the end portion of the opening to the outside of the sputtering unit decreases. Because of such change in the intensity of the magnetic fields, confinement of plasma within the confinement space, particularly confinement of plasma at the opening, is enhanced, and the intensity of the outwardly extending magnetic field which induces electrons to the substrate lowers. Therefore, leakage of plasma, electrons, etc. to the substrate is reduced, and thus film formation can be performed at a low temperature as compared with the case of a conventional sputtering apparatus, and damage to an underlying layer can be reduced. Furthermore, since confinement of plasma is enhanced, film formation can be performed under higher vacuum, and a film of high quality can be formed.

The distribution of the magnetic fields represented by magnetic fluxes FA1 and FB1 of FIG. 2, which extend within the sputtering unit, varies in accordance with lowering of the intensity of the magnetic fields represented by magnetic fluxes FA2 and FB2 of FIG. 2, which extend to the outside of the opening. Therefore, the distribution of the magnetron-mode magnetic fields represented by magnetic fluxes HA and HB of FIG. 2 varies. Since the sputtering apparatus of the present embodiment includes the magnetic-field regulation means which can regulate merely the magnetron-mode magnetic field, the aforementioned magnetic field distribution can be regulated by means of the magnetic-field regulation means; i.e., the permanent magnet. As described above, when the magnetic-field regulation means is employed in combination with the yoke, the distribution of the magnetic fields for confinement of plasma can be regulated so as to be suitable for formation of various films. Depending on a film to be formed, effects of change in the magnetic field distribution may be neglected, and in such a case, regulation of the magnetic field distribution by means of the magnetic-field regulation means is not required. The magnetic field distribution must be regulated so as to be suitable for a film to be formed. In general, regulation of the magnetic field distribution is determined in a preproduction stage. However, regulation of the magnetic field distribution may be determined on the basis of simulation using test data.

Figure 12:
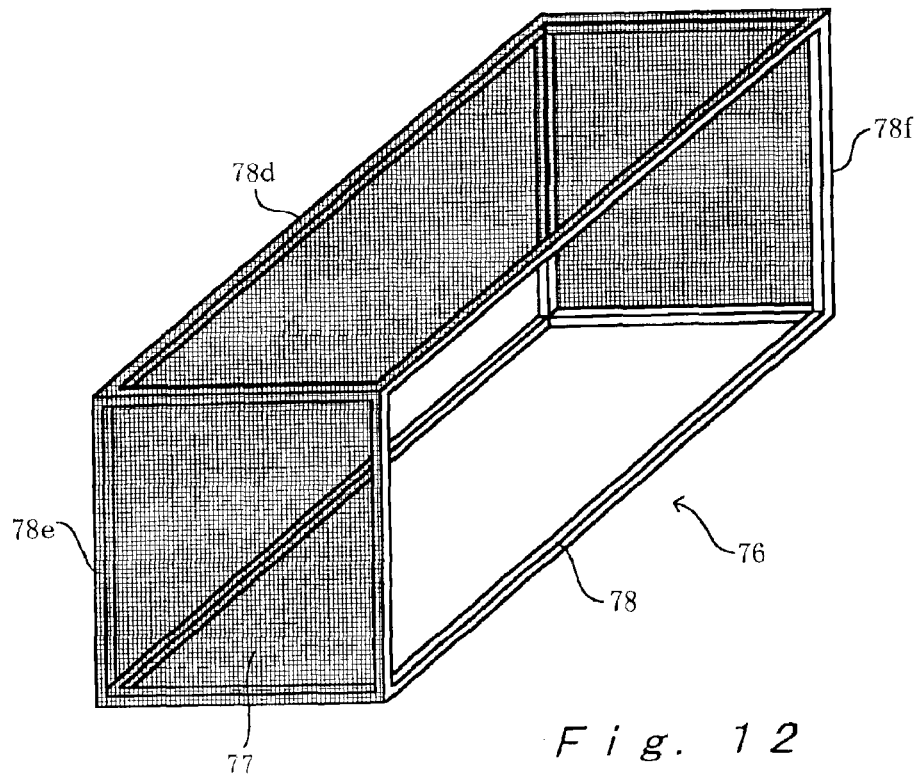
FIG. 12 is a schematic perspective view showing particle holding means employed in the third embodiment.

In the present embodiment, particle holding means is provided on all the interior walls of the box-like unit 70 including the frame 71 and the closure plates 72, excepting the target surfaces. The particle holding means formed of net-like members is provided so as to prevent exfoliation and falling of a film formed through deposition of sputtered particles. As shown in FIG. 12, particle holding means 76 employed in the present embodiment has a rectangular parallelepiped basket-like structure. The particle holding means 76 includes an interior frame 78 which can be accommodated in the frame 71 so as to provide a small clearance between the frame 78 and the frame 71; faces 78d through 78f facing the closure plates 72; and a net-like member 77 mounted so as to cover the faces 78d through 78f. The particle holding means 76 is inserted in the frame 71 and mounted on the closure plate 72 mounted on the face 71d facing the opening. Sputtered particles are held within meshes of the net-like member 77 and between the net-like member 77 and the corresponding closure plates, whereby exfoliation and falling of the deposited film are reliably prevented. That is, exfoliation of a thin film—formed through long-term deposition of sputtered particles on the frame 71 and the closure plates 72—from the interior walls of the box-like unit 70 is prevented, and thus abnormal discharging and deterioration of the quality of a final product, which are caused by falling of the exfoliated fragments of the film, are prevented, attaining long-term reliable operation and improvement of the quality of a final product. The net-like member 77 and the interior frame 78 are formed of an electrically conductive metallic material such as copper. The mesh size of the net-like member 77 affects the quality of a film to be formed, and the mesh size is preferably determined on the basis of test data. So long as the mesh size is 10 to 100 mesh, the object may be achieved generally.

Experiment 1 and Experiment 2

In Experiments 1 and 2, the sputtering apparatus shown in FIG. 7A was employed. The targets 110a and 110b, each having a width (i.e., a size in the width direction of a substrate) of 345 mm, a length of 95 mm, and thickness of 7 mm, were employed. The distance between the target 110a and the target 110b was regulated to 130 mm. A glass substrate having a length (i.e., a size in the conveying direction of the substrate) of 25 cm, a width of 30 cm, and a thickness of 2 mm was employed as the substrate 20. While the substrate 20 was conveyed by means of the tray 22 and the conveying roller 23, a film was deposited onto the surface of the substrate. A DC power supply (trade name: DCG 100, product of ENI) was employed as a sputtering power supply, and 5 kW of power was supplied to the sputtering apparatus.

Variation in film thickness was evaluated as follows. A tape for exfoliating the formed film was applied onto a portion of the substrate 20 in the width direction; the tape was removed from the substrate after film formation; and the thickness of a film deposited onto the substrate was measured in the width direction by use of a contact-type surface roughness meter (product of TENCOH).

In Experiments 1 and 2, plate-like permanent magnets (thickness: 5 mm, length: 50 mm, height: 25 mm) having a magnetic pole intensity of more than 1,000 G (0.1 T) were employed as the magnetic-field regulation means (auxiliary magnets 180a), and the permanent magnets were provided in the trench 181a such that each of the magnets was located 50 mm inward from each end of the trench 181a.

Experiment 1: Indium was employed as a target. After a film was formed, variation in film thickness in the width direction was evaluated by taking as the standard (i.e., 100%) the thickness of a portion of the film that corresponded to the center of the target. As a result, the width of a portion of the film that had a thickness 95% or more of the standard was found to be 15 cm, and the width of a portion of the film that had a thickness 90% or more of the standard was found to be 20 cm. Variation in film thickness was found to be symmetrical with respect to the center of the film.

A film was formed by use of a conventional sputtering apparatus including no magnetic-field regulation means, and variation in film thickness in the width direction was evaluated by taking as the standard (i.e., 100%) the thickness of a portion of the film that corresponded to the center of the target. As a result, the width of a portion of the film that had a thickness 95% or more of the standard was found to be 7.5 cm, and the width of a portion of the film that had a thickness 90% or more of the standard was found to be 13 cm. The position of a portion of the film that had the largest thickness was found to be deviated, by 5 cm, from the position of a portion of the film that corresponded to the center of the target.

Experiment 2: Copper was employed as a target. After a film was formed, variation in film thickness in the width direction was evaluated by taking as the standard (i.e., 100%) the thickness of a portion of the film that corresponded to the center of the target. As a result, the width of a portion of the film that had a thickness 95% or more of the standard was found to be 15 cm, and the width of a portion of the film that had a thickness 90% or more of the standard was found to be 20 cm. Variation in film thickness was found to be symmetrical with respect to the center of the substrate.

A film was formed by use of a conventional sputtering apparatus including no magnetic-field regulation means, and variation in film thickness in the width direction was evaluated by taking as the standard (i.e., 100%) the thickness of a portion of the film that corresponded to the center of the target. As a result, the width of a portion of the film that had a thickness 95% or more of the standard was found to be 8.0 cm, and the width of a portion of the film that had a thickness 90% or more of the standard was found to be 13 cm. The position of a portion of the film that had the largest thickness was found to be deviated, by 1 cm, from the position of a portion of the film that corresponded to the center of the target.

Erosion of the targets employed in Experiments 1 and 2 was observed. The results revealed that when the conventional sputtering apparatus including no magnetic-field regulation means was employed, the degree of erosion of a first pair of diagonal corner portions of the rectangular target was somewhat higher than that of a second pair of diagonal corner portions of the target. In contrast, when the sputtering apparatus of the present invention was employed, the entire surface of the rectangular target including four corners was found to be uniformly eroded.

When the degree of erosion differs from portion to portion in the target, the surface of a backing plate is exposed through more eroded portions of the target, and thus the deposited film is contaminated with the material of the backing plate. As a result, the target is no longer employed. When such variation in the erosion degree of the target is increased, utilization efficiency of the target is lowered. Utilization efficiency of the target employed in the sputtering apparatus of the present invention was enhanced by about 10% as compared with that of the target employed in the conventional apparatus.

In the sputtering apparatus of the present invention, film formation was performed at the same sputtering rate as in the case of the conventional sputtering apparatus. After the sputtering apparatus of the present invention was employed for a long period of time, deterioration of the permanent magnet 130a (magnetic-field generation means) and the auxiliary magnet 180a (magnetic-field regulation means) was not observed. In the sputtering apparatus of the present invention, in which the cooling jacket is provided within the backing unit, cooling effects substantially equal to those obtained by the conventional sputtering apparatus were found to be obtained.

Experiment 3

As described below, films were formed by use of the sputtering apparatus of the third embodiment (shown in FIG. 9) and a comparative sputtering apparatus (i.e., a sputtering apparatus fabricated by removing the yoke 190 from the sputtering apparatus of the third embodiment).

As described below, silicon oxide films were formed by use of the sputtering apparatus of the third embodiment which has the same size as the apparatus used in Experiment 1 and the comparative sputtering apparatus, and the temperature of the substrate was measured during the course of film formation.

Specifically, an Si target was employed, and a silicon wafer was employed as a substrate. While the substrate was fixed at a position beneath the opening of the sputtering unit, a silicon oxide film was formed as follows. Firstly, the vacuum chamber 10 was evacuated to $1.1 \times 1^{-4}$ Pa, and subsequently, Ar gas and $O_2$ gas, serving as sputtering gasses, were fed at a ratio of 4:1 such that the sputtering pressure became 0.5 Pa, followed by sputtering under supply of 1,000 W of DC power, to thereby perform film formation for 15 minutes. During the course of film formation, change in the temperature of the substrate was measured. The temperature of the substrate was measured by use of a thermocouple mounted on the substrate. The measurement results are shown in Table 1.

TABLE 1

| Time (minutes) | Temperature of substrate (° C.) (sputtering apparatus of the third embodiment) | Temperature of substrate (° C.) (comparable sputtering apparatus) |
|---|---|---|
| 0 (initial) | 24 | 25 |
| 1 | 33 | 47 |
| 2 | 39 | 60 |
| 3 | 44 | 69 |
| 5 | 51 | 83 |
| 7 | 58 | 93 |
| 10 | 66 | 104 |
| 12 | 70 | 111 |
| 15 | 76 | 118 |

As is clear from Table 1, when the sputtering apparatus of the third embodiment is employed, an increase in substrate temperature is greatly suppressed as compared with the case where the comparative apparatus is employed. The films formed by use of these apparatuses have almost the same thickness. Therefore, when a film of predetermined thickness is formed by use of the sputtering apparatus of the third embodiment, the film is formed at a temperature lower, by some tens of degrees, than a temperature required for film formation by use of the comparative apparatus. When the sputtering apparatus of the third embodiment is employed, the temperature of the substrate increases at the time of 15 minutes after initiation of film formation. However, on the basis of the measurement results, the final temperature of the substrate is considered to become not higher than 100° C. The results show that when the sputtering apparatus of the third embodiment is employed, a film is formed on a substrate or underlying layer of low heat resistance without raising any problem. Therefore, the sputtering apparatus of the third embodiment can be widely employed for forming a functional film on, for example, an organic film or an organic layer.

Although the present invention has been described with reference to the aforementioned embodiments, it should be understood that the present invention is not limited to the embodiments described herein.

The aforementioned embodiments of the present invention include electron reflection means, but the present invention can be applied to a facing-targets-type sputtering apparatus including no electron reflection means. In addition, the present invention can be applied to a conventional facing-targets-type sputtering apparatus shown in FIG. 1.

The present invention can also be applied to a box-like unit in which a closure plate mounted on the side facing the opening of the unit is replaced with a target unit, or a box-like unit in which all the closure plates are replaced with target units.

What is claimed is:

1. A facing-targets-type sputtering apparatus comprising a sputtering unit comprising a pair of facing targets which are disposed a predetermined distance away from each other, and permanent magnets serving as magnetic-field generation means which are disposed around each of the facing targets, the permanent magnets being provided so as to generate a facing-mode magnetic field and a magnetron-mode magnetic field, the facing-mode magnetic field extending in the direction perpendicular to the facing targets in such a manner as to surround a confinement space provided between the targets, and the magnetron-mode magnetic field extending from the vicinity of a peripheral edge portion of each of the targets to a center portion thereof, thereby confining plasma within the confinement space by means of these magnetic fields for forming a thin film on a substrate disposed beside the confinement space, which apparatus further comprises magnetic-field regulation means for regulating the magnetron-mode magnetic field without regulating the facing-mode magnetic field.

2. A facing-targets-type sputtering apparatus according to claim 1, wherein the magnetic-field regulation means locally regulates the magnetron-mode magnetic field.

3. A facing-targets-type sputtering apparatus according to claim 1, wherein the magnetic-field regulation means is a permanent magnet.

4. A facing-targets-type sputtering apparatus according to claim 3, wherein the magnetic-field regulation means is provided on the side opposite the sputtering surface of each of the targets.

5. A facing-targets-type sputtering apparatus according to claim 4, wherein the magnetic-field regulation means is provided along the centerline of each of the targets that is parallel to the substrate.

6. A facing-targets-type sputtering apparatus according to claim 5, wherein each of the targets has a rectangular shape, and the magnetic-field regulation means is provided on each end of the target along the longitudinal direction thereof.

7. A facing-targets-type sputtering apparatus according to claim 1, which further comprises electron reflection means for reflecting electrons in the vicinity of a front portion of the magnetic-field generation means that faces the confinement space.

8. A facing-targets-type sputtering apparatus according to claim 1, wherein the sputtering unit is a box-like sputtering unit in which all the faces that define the confinement space, excepting the face facing the substrate, are closed.

9. A facing-targets-type sputtering apparatus according to claim 8, wherein all the interior walls of the box-like sputtering unit, excepting the target surfaces, are covered with a net-like member.

10. A facing-targets-type sputtering apparatus comprising a sputtering unit comprising a pair of facing targets which are disposed a predetermined distance away from each other, and permanent magnets which are disposed along the periphery of each of the facing targets, the permanent magnets being provided so as to generate a magnetic field in the direction perpendicular to the facing targets in such a manner as to surround a confinement space provided between the targets, thereby confining plasma within the confinement space by means of the magnetic field for forming a film on a substrate disposed beside the confinement space, which apparatus further comprises a yoke which magnetically connects open-side-facing magnetic poles of the permanent magnets.

11. A facing-targets-type sputtering apparatus according to claim 10, wherein the yoke includes pole sections provided on the open-side-facing magnetic poles of the permanent magnets, and a connection section which magnetically connects the pole sections, the pole sections and the connection section being formed of a ferromagnetic material.

12. A facing-targets-type sputtering apparatus according to claim 11, wherein the connection section is provided at least at one side of the sputtering unit that faces the substrate, the connection section being formed of a plate-like member which has an openings facing the substrate.

13. A facing-targets-type sputtering apparatus according to claim 10, wherein the permanent magnets are provided around each of the facing targets so as to generate a magnetron-mode magnetic field.

14. A facing-targets-type sputtering apparatus according to claim 13, which further comprises magnetic-field regulation means for regulating the magnetron-mode magnetic field.

15. A facing-targets-type sputtering apparatus according to claim 14, wherein the magnetic-field regulation means is a permanent magnet.

16. A facing-targets-type sputtering apparatus according to claim 15, wherein the magnetic-field regulation means is provided on the side opposite the sputtering surface of each of the targets.

17. A facing-targets-type sputtering apparatus according to claim 16, wherein the magnetic-field regulation means is provided along the centerline of each of the targets that is parallel to the substrate.

18. A facing-targets-type sputtering apparatus according to claim 13, which further comprises an electron reflection plate for reflecting electrons on a front end portion of the magnetic-field generation means.

19. A facing-targets-type sputtering apparatus according to claim 10, wherein the sputtering unit is a box-like unit in which all the sides of the unit, excepting the opening side facing the substrate, are covered by targets or closure plates.

20. A facing-targets-type sputtering apparatus according to claim 19, wherein the box-like unit includes a rectangular parallelepiped or cubic frame, in which targets or closure plates are hermetically mounted on all the faces of the frame, excepting the opening face facing the substrate, and the box-like unit is provided on a side wall of a vacuum chamber at the opening face.

21. A facing-targets-type sputtering apparatus according to claim 19, wherein basket-like particle holding means for holding sputtered particles is provided on the closure plate mounted on the side of the box-like unit opposite the opening side thereof.

22. A facing-targets-type sputtering apparatus according to claim 20, wherein the yoke is provided so as to cover all the sides of the box-like unit that are located outside the vacuum chamber.

23. A facing-targets-type sputtering apparatus comprising a sputtering unit comprising a pair of facing targets which are disposed a predetermined distance away from each other, and permanent magnets which are disposed along the periphery of each of the facing targets, the permanent magnets being provided so as to generate a magnetic field in the direction perpendicular to the facing targets in such a manner as to surround a confinement space provided between the targets, thereby confining plasma within the confinement space by means of the magnetic field for forming a film on a substrate disposed beside the confinement space, which apparatus further comprises a metallic backing unit provided on the back side of each of the targets; a metallic support unit comprising a receiving section for accommodating the backing unit and accommodation sections for accommodating the permanent magnets, the accommodation sections being provided in peripheral walls which define the receiving section; and a cooling jacket provided in the backing unit, the cooling jacket being closed excepting a port connected to a pipe, wherein the backing unit is accommodated in the receiving section such that the back surface of the backing unit is in direct contact with the support unit.

24. A facing-targets-type sputtering apparatus according to claim 23, which further comprises a yoke which magnetically connects open-side-facing magnetic poles of the permanent magnets.

25. A facing-targets-type sputtering apparatus according to claim 23, wherein the permanent magnets are provided around each of the facing targets so as to generate a magnetron-mode magnetic field, and magnetic-field regulation means for regulating the magnetron-mode magnetic field is provided.

* * * * *